(12) United States Patent
Utsunomiya et al.

(10) Patent No.: US 7,327,406 B2
(45) Date of Patent: Feb. 5, 2008

(54) METHODS AND APPARATUS FOR IMPLEMENTING A RECEIVER ON A MONOLITHIC INTEGRATED CIRCUIT

(75) Inventors: Kimitake Utsunomiya, Sunnyvale, CA (US); Takatsugu Kamata, Santa Clara, CA (US)

(73) Assignee: RFStream Corporation, Osaka (JP)

( * ) Notice: Subject to any disclaimer, the term of this patent is extended or adjusted under 35 U.S.C. 154(b) by 751 days.

(21) Appl. No.: 10/273,389

(22) Filed: Oct. 16, 2002

(65) Prior Publication Data
US 2003/0132455 A1    Jul. 17, 2003

Related U.S. Application Data

(60) Provisional application No. 60/329,797, filed on Oct. 16, 2001.

(51) Int. Cl.
H04N 5/50   (2006.01)
H04N 5/44   (2006.01)

(52) U.S. Cl. .................. 348/731; 348/725; 348/726; 348/729; 455/189.1

(58) Field of Classification Search ........... 348/731, 348/732, 733, 570, 725, 729, 726; 455/180.2, 455/188.1, 188.2, 189.1, 190.1; 333/205, 333/207, 209; 334/87, 89
See application file for complete search history.

(56) References Cited

U.S. PATENT DOCUMENTS

| | | | |
|---|---|---|---|
| 1,735,742 A | 11/1929 | Fetter |
| 2,140,770 A | 12/1938 | Schofield |
| 2,325,174 A | 7/1943 | Cooper |
| 2,464,557 A | 3/1949 | Crockett |
| 2,496,177 A | 1/1950 | Richards et al. |
| 2,531,312 A | 11/1950 | Loon |
| 2,549,789 A | 4/1951 | Ferrill |
| 2,796,524 A | 6/1957 | Ferrill |
| 2,801,341 A | 7/1957 | Jaffe |
| 3,252,096 A | 5/1966 | Carlson |
| 3,400,345 A | 9/1968 | Oloff |
| 3,488,595 A | 1/1970 | Vasile |
| 3,509,500 A | 4/1970 | McNair et al. |
| 3,544,903 A | 12/1970 | Sakamoto |
| 3,686,575 A | 8/1972 | Chamberlain |
| 3,794,941 A | 2/1974 | Templin |
| 3,931,578 A | 1/1976 | Gittinger |
| 4,112,378 A | 9/1978 | Ito et al. |

(Continued)

FOREIGN PATENT DOCUMENTS

EP    0392449 A1    10/1990

(Continued)

*Primary Examiner*—David Ometz
*Assistant Examiner*—Jean W. Désir
(74) *Attorney, Agent, or Firm*—Stattler Johansen & Adeli LLP

(57) ABSTRACT

A monolithic integrated circuit includes a tuner and a SAW filter function. The tuner receives a radio frequency (RF) television signal that has a range of fundamental frequencies from 55 mega hertz (Mhz) to 880 Mhz. The tuner down converts the RF television signal to an intermediate frequency (IF) television signal that has a low fundamental frequency. In one embodiment, the SAWF filter performs the SAW filter function on the IF television signal. In another embodiment, the SAWF filter performs the SAW filter function at baseband. An IF processor for processing the IF television signal to generate a video television signal and an audio television signal is disclosed.

10 Claims, 48 Drawing Sheets

U.S. PATENT DOCUMENTS

| | | | |
|---|---|---|---|
| 4,118,679 A | 10/1978 | Hiday et al. | |
| 4,138,654 A | 2/1979 | Luhowy | |
| 4,296,391 A | 10/1981 | Hazama et al. | |
| 4,379,271 A | 4/1983 | Lehmann | |
| 4,456,895 A | 6/1984 | Landt et al. | |
| 4,514,763 A | 4/1985 | Rindal | |
| 4,555,809 A | 11/1985 | Carlson | |
| 4,598,423 A | 7/1986 | Hettiger | |
| 4,785,253 A | 11/1988 | Hughes | |
| 4,789,897 A | 12/1988 | Kappeler et al. | |
| 4,812,851 A | 3/1989 | Giubardo | |
| 4,818,903 A | 4/1989 | Kawano | |
| 4,882,614 A | 11/1989 | Kageyama et al. | |
| 4,970,479 A | 11/1990 | Landt et al. | |
| 4,985,769 A | 1/1991 | Yasumoto et al. | |
| 4,988,902 A | 1/1991 | Dingwall | |
| 5,077,542 A | 12/1991 | Lanoiselee | |
| 5,122,868 A | 6/1992 | Isnardi | |
| 5,146,337 A * | 9/1992 | Grubbs | 348/729 |
| 5,146,338 A * | 9/1992 | Lehmann et al. | 348/729 |
| 5,148,280 A * | 9/1992 | Wignot et al. | 348/729 |
| 5,155,580 A | 10/1992 | Gibson et al. | |
| 5,177,613 A * | 1/1993 | Rumreich | 348/738 |
| 5,187,445 A | 2/1993 | Jackson | |
| 5,264,937 A * | 11/1993 | Christopher | 348/725 |
| 5,287,180 A | 2/1994 | White | |
| 5,386,239 A | 1/1995 | Wang et al. | |
| 5,491,715 A | 2/1996 | Flaxl | |
| 5,519,265 A | 5/1996 | Latham | |
| 5,525,940 A | 6/1996 | Heikkila et al. | |
| 5,648,823 A * | 7/1997 | Stepp et al. | 348/726 |
| 5,663,773 A | 9/1997 | Goeckler | |
| 5,673,293 A * | 9/1997 | Scarpa et al. | 375/321 |
| 5,737,035 A | 4/1998 | Rotzoll | |
| 5,898,900 A * | 4/1999 | Richter et al. | 725/70 |
| 5,905,398 A | 5/1999 | Todsen et al. | |
| 5,914,633 A | 6/1999 | Comino et al. | |
| 5,983,088 A * | 11/1999 | Aschwanden | 455/188.2 |
| 5,999,802 A * | 12/1999 | Aschwanden | 455/196.1 |
| 6,016,170 A * | 1/2000 | Takayama et al. | 348/731 |
| 6,094,236 A * | 7/2000 | Abe et al. | 348/731 |
| 6,147,713 A * | 11/2000 | Robbins et al. | 348/555 |
| 6,148,037 A * | 11/2000 | Abe | 375/321 |
| 6,169,569 B1 * | 1/2001 | Widmer et al. | 725/111 |
| 6,177,964 B1 * | 1/2001 | Birleson et al. | 348/725 |
| 6,215,830 B1 * | 4/2001 | Temerinac et al. | 375/326 |
| 6,219,376 B1 | 4/2001 | Zhodzishsky et al. | |
| 6,226,509 B1 | 5/2001 | Mole et al. | |
| 6,243,567 B1 | 6/2001 | Saito | |
| 6,256,495 B1 | 7/2001 | Francisco et al. | |
| 6,275,113 B1 | 8/2001 | Nakano et al. | |
| 6,307,443 B1 | 10/2001 | Gabara | |
| 6,324,233 B1 | 11/2001 | Sempel et al. | |
| 6,351,293 B1 | 2/2002 | Perlow | |
| 6,359,940 B1 * | 3/2002 | Ciccarelli et al. | 375/316 |
| 6,377,315 B1 | 4/2002 | Carr et al. | |
| 6,470,055 B1 | 10/2002 | Feyer | |
| 6,535,075 B2 | 3/2003 | Frech et al. | |
| 6,535,722 B1 | 3/2003 | Rosen et al. | |
| 6,538,521 B2 | 3/2003 | Kobayashi et al. | |
| 6,593,828 B1 | 7/2003 | Helfenstein et al. | |
| 6,597,748 B1 | 7/2003 | Hietala et al. | |
| 6,628,728 B1 | 9/2003 | McCarty, Jr. | |
| 6,631,256 B2 | 10/2003 | Suominen | |
| 6,636,085 B2 | 10/2003 | Okazaki et al. | |
| 6,657,678 B1 * | 12/2003 | Mizukami et al. | 348/726 |
| 6,667,649 B1 | 12/2003 | Lee | |
| 6,725,463 B1 * | 4/2004 | Birleson | 725/151 |
| 6,750,734 B2 | 6/2004 | Utsunomiya et al. | |
| 6,778,022 B1 | 8/2004 | Zhang et al. | |
| 6,778,594 B1 | 8/2004 | Liu | |
| 6,795,695 B1 * | 9/2004 | Brekelmans et al. | 455/192.2 |
| 6,882,245 B2 | 4/2005 | Utsunomiya et al. | |
| 6,897,791 B2 * | 5/2005 | Jaffe et al. | 341/50 |
| 6,424,206 B2 | 7/2005 | Takahashi et al. | |
| 6,424,209 B1 | 7/2005 | Gorecki et al. | |
| 6,940,365 B2 | 9/2005 | Kamata et al. | |
| 2003/0053562 A1 | 3/2003 | Busson et al. | |
| 2003/0097601 A1 | 5/2003 | Glas et al. | |
| 2003/0186671 A1 | 10/2003 | Prodanov et al. | |
| 2003/0197810 A1 | 10/2003 | Jaffe | |

FOREIGN PATENT DOCUMENTS

| | | |
|---|---|---|
| EP | 0 676 880 A2 | 10/1995 |
| EP | 0 707 379 A1 | 4/1996 |
| WO | WO95/22839 | 8/1995 |
| WO | WO96/39778 | 12/1996 |
| WO | WO 01 06637 A1 | 1/2001 |
| WO | WO 01 28310 A2 | 4/2001 |

\* cited by examiner

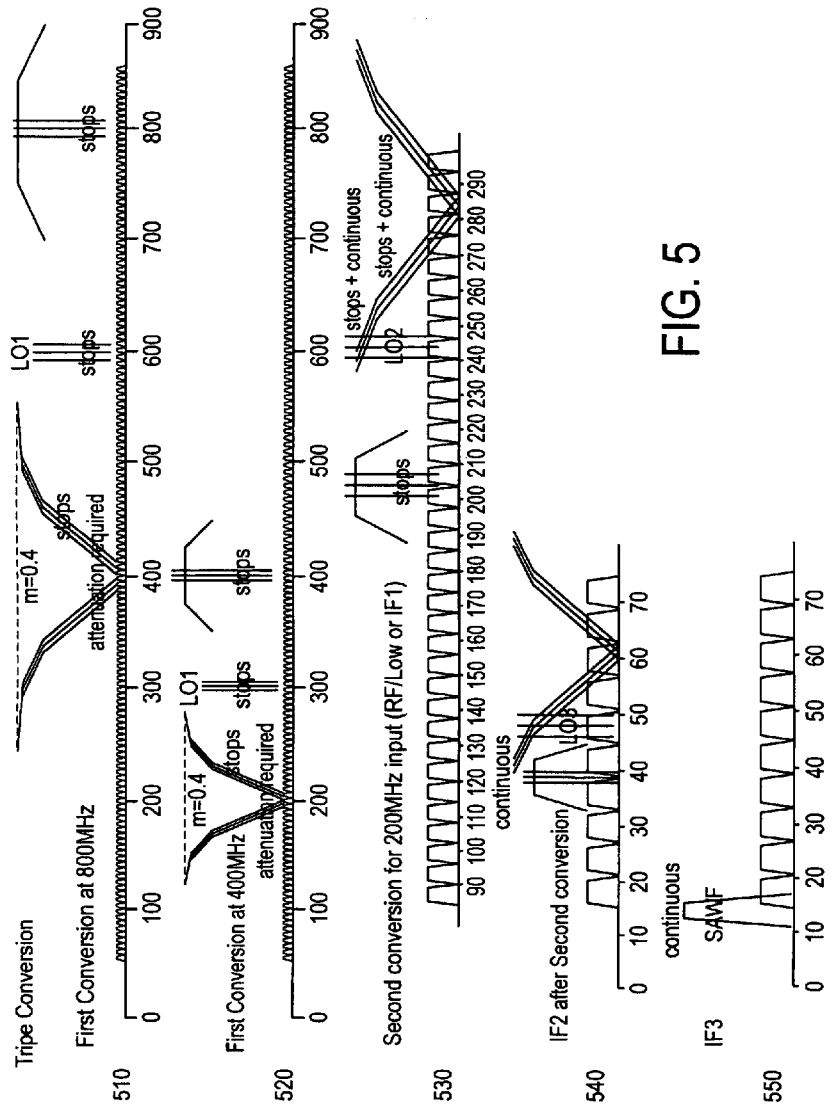

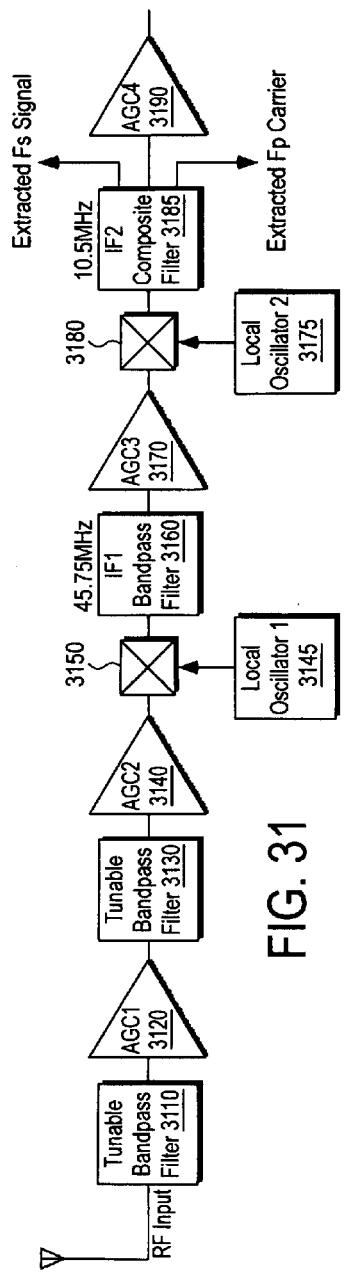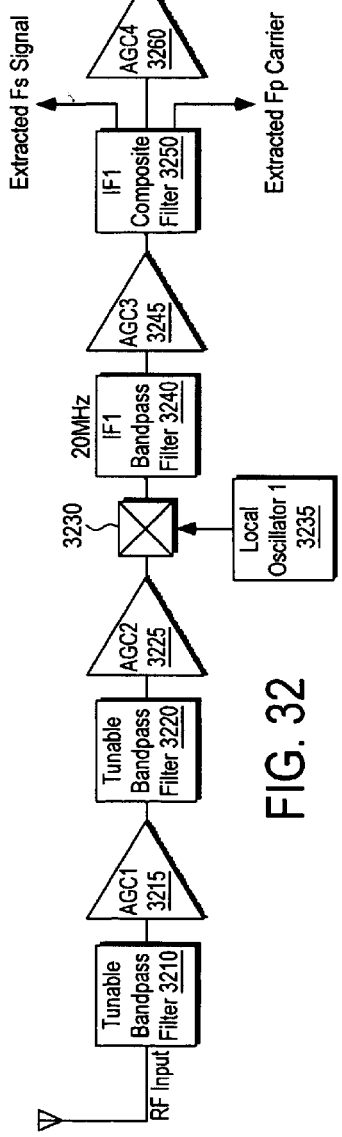

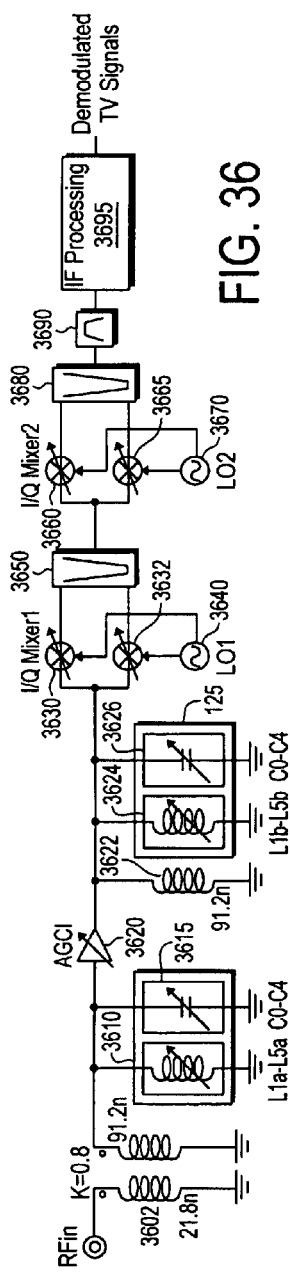
FIG. 36
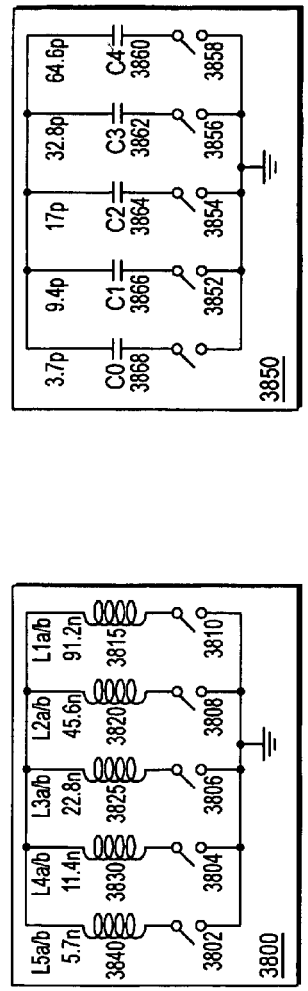
FIG. 38B
FIG. 38A

| I/L | N | 1 | 2 | 3 | 4 | 5 | 6 | 7 | 8 |
|---|---|---|---|---|---|---|---|---|---|
| Ind(nH) | Code=> | 00000 | 00001 | 00010 | 00011 | 00100 | 00101 | 00110 | 00111 |
| 5.7 | L5 | 0 | 0 | 0 | 0 | 0 | 0 | 0 | 0 |
| 11.4 | L4 | 0 | 0 | 0 | 0 | 0 | 0 | 0 | 0 |
| 22.8 | L3 | 0 | 0 | 0 | 0 | 1 | 1 | 1 | 1 |
| 45.6 | L2 | 0 | 0 | 1 | 1 | 0 | 0 | 1 | 1 |
| 91.2 | L1 | 0 | 1 | 0 | 1 | 0 | 1 | 0 | 1 |
| 91.2 | L0 | 1 | 1 | 1 | 1 | 1 | 1 | 1 | 1 |
| | Total L | 91.20 | 45.60 | 30.40 | 22.80 | 18.24 | 15.20 | 13.03 | 11.40 |

FIG. 40

| Ind(nH) | rs1 | RMOS | rs | N | 1 | 2 | 3 | 4 | 5 | 6 | 7 | 8 |
|---|---|---|---|---|---|---|---|---|---|---|---|---|
| | | | | | 00000 | 00001 | 00010 | 00011 | 00100 | 00101 | 00110 | 00111 |
| 5.7 | .7 | 1.1 | 1.8 | L5 | 0 | 0 | 0 | 0 | 0 | 0 | 0 | 0 |
| 11.4 | .7 | 1.6 | 2.3 | L4 | 0 | 0 | 0 | 0 | 0 | 0 | 0 | 0 |
| 22.8 | .5 | 2.3 | 2.8 | L3 | 0 | 0 | 0 | 0 | 1 | 1 | 1 | 1 |
| 45.6 | 1 | 3.2 | 4.2 | L2 | 0 | 0 | 1 | 1 | 0 | 0 | 1 | 1 |
| 91.2 | 1 | 4.6 | 5.6 | L1 | 0 | 1 | 0 | 1 | 0 | 1 | 0 | 1 |
| 91.2 | 1 | 4.6 | 5.6 | L0 | 1 | 1 | 1 | 1 | 1 | 1 | 1 | 1 |
| Total | | | | | 91.20 | 45.60 | 30.40 | 22.80 | 18.24 | 15.20 | 13.03 | 11.40 |
| | | | rs | | 5.6 | 2.8 | 2.4 | 1.68 | 1.87 | 1.4 | 1.29 | 1.05 |

FIG. 41

| C | M | 16 - 8 | 16 - 8 | 12 - 10 | 12 - 9 | 11 - 9 | 10 - 8 | 9 - 7 | 8 - 4 |
|---|---|---|---|---|---|---|---|---|---|
| Cap(pF) | (M-1) | N=1 | N=2 | N=3 | N=4 | N=5 | N=6 | N=7 | N=8 |
| 127.7 | 15 | 46.64 | 65.95 | 80.78 | 93.27 | 104.28 | 114.24 | 123.39 | 131.91 |
| 118.3 | 14 | 48.45 | 68.52 | 83.91 | 96.9 | 108.33 | 118.67 | 128.18 | 137.03 |
| 110.7 | 13 | 50.09 | 70.84 | 86.76 | 100.18 | 112.01 | 122.7 | 132.53 | 141.68 |
| 101.3 | 12 | 52.36 | 74.04 | 90.69 | 104.71 | 117.07 | 128.25 | 138.52 | 148.09 |
| 94.9 | 11 | 54.09 | 76.50 | 93.69 | 108.19 | 120.96 | 132.5 | 143.12 | 153 |
| 85.6 | 10 | 56.98 | 80.58 | 98.69 | 113.96 | 127.41 | 139.57 | 150.75 | 161.16 |
| 77.9 | 9 | 59.71 | 84.44 | 103.42 | 119.41 | 133.51 | 146.25 | 157.97 | 168.88 |
| 68.5 | 8 | 63.66 | 90.03 | 110.26 | 127.32 | 142.34 | 155.93 | 168.42 | 180.05 |
| 62.9 | 7 | 66.47 | 94.00 | 115.12 | 132.93 | 148.62 | 162.81 | 175.85 | 187.99 |
| 53.5 | 6 | 72.05 | 101.9 | 124.80 | 144.1 | 161.11 | 176.49 | 190.63 | 203.79 |
| 45.9 | 5 | 77.82 | 110.6 | 134.79 | 155.65 | 174.02 | 190.63 | 205.9 | 220.12 |
| 36.5 | 4 | 87.24 | 123.38 | 151.11 | 174.49 | 195.08 | 213.7 | 230.83 | 246.76 |
| 30.1 | 3 | 96.08 | 135.87 | 166.41 | 192.15 | 214.83 | 235.34 | 254.19 | 271.74 |
| 20.7 | 2 | 115.78 | 163.74 | 200.53 | 231.56 | 258.89 | 283.6 | 306.32 | 327.47 |
| 13.1 | 1 | 145.72 | 206.08 | 252.39 | 291.44 | 325.84 | 356.94 | 385.54 | 412.16 |
| 3.7 | 0 | 273.61 | 386.95 | 473.91 | 547.22 | 611.82 | 670.21 | 723.91 | 773.89 |

FIG. 44

| C | | M | | 16-8 | 16-8 | 12-10 | 12-9 | 11-9 | 10-8 | 9-7 | 8-4 |
|---|---|---|---|---|---|---|---|---|---|---|---|
| Cap(pF) | RMOS | | (M-1) | N=1 | N=2 | N=3 | N=4 | N=5 | N=6 | N=7 | N=8 |
| 127.7 | 0.0 | | 15 | 46.64 | 65.95 | 80.78 | 93.27 | 104.28 | 114.24 | 123.39 | 131.91 |
| 118.3 | 2.6 | | 14 | 48.45 | 68.52 | 83.91 | 96.9 | 108.33 | 118.67 | 128.18 | 137.03 |
| 110.7 | 2.4 | | 13 | 50.09 | 70.84 | 86.76 | 100.18 | 112.01 | 122.7 | 132.53 | 141.68 |
| 101.3 | 2.0 | | 12 | 52.36 | 74.04 | 90.69 | 104.71 | 117.07 | 128.25 | 138.52 | 148.09 |
| 94.9 | 2.2 | | 11 | 54.09 | 76.50 | 93.69 | 108.19 | 120.96 | 132.5 | 143.12 | 153 |
| 85.6 | 1.8 | | 10 | 56.98 | 80.58 | 98.69 | 113.96 | 127.41 | 139.57 | 150.75 | 161.16 |
| 77.9 | 1.5 | | 9 | 59.71 | 84.44 | 103.42 | 119.41 | 133.51 | 146.25 | 157.97 | 168.88 |
| 68.5 | 1.1 | | 8 | 63.66 | 90.03 | 110.26 | 127.32 | 142.34 | 155.93 | 168.42 | 180.05 |
| 62.9 | 2.0 | | 7 | 66.47 | 94.00 | 115.12 | 132.93 | 148.62 | 162.81 | 175.85 | 187.99 |
| 53.5 | 1.5 | | 6 | 72.05 | 101.9 | 124.80 | 144.1 | 161.11 | 176.49 | 190.63 | 203.79 |
| 45.9 | 1.3 | | 5 | 77.82 | 110.6 | 134.79 | 155.65 | 174.02 | 190.63 | 205.9 | 220.12 |
| 36.5 | .9 | | 4 | 87.24 | 123.38 | 151.11 | 174.49 | 195.08 | 213.7 | 230.83 | 246.76 |
| 30.1 | 1.1 | | 3 | 96.08 | 135.87 | 166.41 | 192.15 | 214.83 | 235.34 | 254.19 | 271.74 |
| 20.7 | .7 | | 2 | 115.78 | 163.74 | 200.53 | 231.56 | 258.89 | 283.6 | 306.32 | 327.47 |
| 13.1 | .4 | | 1 | 145.72 | 206.08 | 252.39 | 291.44 | 325.84 | 356.94 | 385.54 | 412.16 |
| 3.7 | 0 | | 0 | 273.61 | 386.95 | 473.91 | 547.22 | 611.82 | 670.21 | 723.91 | 773.89 |

FIG. 45

| C | M | 1 | 2 | 3 | 4 | 5 | 6 | 7 | 8 |
|---|---|---|---|---|---|---|---|---|---|
| Cap(pF) | Code=> (M-1) | 0 | 1 | 2 | 3 | 4 | 5 | 6 | 7 |
| 64.6 | C4 | 0 | 0 | 0 | 0 | 0 | 0 | 0 | 0 |
| 32.8 | C3 | 0 | 0 | 0 | 0 | 1 | 1 | 1 | 1 |
| 17 | C2 | 0 | 0 | 1 | 1 | 0 | 0 | 1 | 1 |
| 9.4 | C1 | 0 | 1 | 0 | 1 | 0 | 1 | 0 | 1 |
| 3.7 | C0 | 1 | 1 | 1 | 1 | 1 | 1 | 1 | 1 |
|  | Total C | 3.7 | 13.1 | 20.7 | 30.1 | 36.5 | 45.9 | 53.5 | 62.9 |

FIG. 47

| I/L | N | 11-32 | 15-32 | 14-24 | 12-19 | 11-15 | 11-13 | 10-12 | 8-11 |
|---|---|---|---|---|---|---|---|---|---|
| Ind(nH) | (N-1) | M=1 | M=2 | M=3 | M=4 | M=5 | M=6 | M=7 | M=8 |
| 2.85 | 31 | 1490.62 | 860.61 | 666.63 | 563.4 | 496.87 | 449.44 | 413.42 | 384.88 |
| 2.94 | 30 | 1467.15 | 847.06 | 656.13 | 554.53 | 489.05 | 442.36 | 406.91 | 378.82 |
| 3.04 | 29 | 1443.29 | 833.28 | 645.46 | 545.51 | 481.10 | 435.17 | 400.30 | 372.66 |
| 3.1 | 28 | 1419.03 | 819.28 | 634.61 | 536.34 | 473.01 | 427.85 | 393.57 | 366.39 |
| 3.3 | 27 | 1394.35 | 805.03 | 623.57 | 527.01 | 464.78 | 420.41 | 386.72 | 360.02 |
| 3.4 | 26 | 1369.22 | 790.52 | 612.34 | 517.52 | 456.41 | 412.84 | 379.75 | 353.53 |
| 3.5 | 25 | 1343.63 | 775.74 | 600.89 | 507.84 | 447.88 | 405.12 | 372.66 | 346.92 |
| 3.6 | 24 | 1317.54 | 760.68 | 589.22 | 497.98 | 439.18 | 397.25 | 365.42 | 340.19 |
| 3.8 | 23 | 1290.92 | 745.31 | 577.32 | 487.92 | 430.31 | 389.23 | 358.04 | 333.31 |
| 4.0 | 22 | 1263.74 | 729.62 | 565.16 | 477.65 | 421.25 | 381.03 | 350.5 | 326.30 |
| 4.1 | 21 | 1235.96 | 713.58 | 552.74 | 567.15 | 411.99 | 372.66 | 342.79 | 319.12 |
| 4.3 | 20 | 1207.54 | 697.17 | 540.03 | 456.41 | 402.51 | 364.09 | 334.91 | 311.79 |
| 4.6 | 19 | 1178.44 | 680.37 | 527.01 | 445.41 | 392.81 | 355.31 | 326.84 | 304.27 |
| 4.8 | 18 | 1148.60 | 663.15 | 513.67 | 434.13 | 382.87 | 346.32 | 318.56 | 296.57 |
| 5.1 | 17 | 1117.97 | 645.46 | 499.97 | 422.55 | 372.66 | 337.08 | 310.07 | 288.66 |
| 5.4 | 16 | 1086.47 | 627.27 | 485.88 | 410.65 | 362.16 | 327.58 | 301.33 | 280.52 |
| 5.7 | 15 | 1054.03 | 608.54 | 471.38 | 398.39 | 351.34 | 317.80 | 292.34 | 272.15 |
| 6.1 | 14 | 1020.56 | 589.22 | 456.41 | 385.74 | 340.19 | 307.71 | 283.05 | 263.51 |
| 6.5 | 13 | 985.95 | 569.24 | 440.93 | 372.66 | 328.65 | 297.28 | 273.45 | 254.57 |

FIG. 50A

| 7.0 | 12 | 950.09 | 548.53 | 424.89 | 359.10 | 316.70 | 286.46 | 263.51 | 245.31 |
|---|---|---|---|---|---|---|---|---|---|
| 7.6 | 11 | 912.82 | 527.01 | 408.22 | 345.01 | 304.27 | 275.17 | 253.17 | 235.69 |
| 8.3 | 10 | 873.95 | 504.58 | 390.84 | 330.32 | 291.32 | 263.51 | 242.39 | 225.65 |
| 9.1 | 9 | 833.28 | 481.10 | 372.66 | 314.95 | 277.76 | 251.24 | 231.11 | 215.15 |
| 10.1 | 8 | 790.52 | 456.41 | 353.53 | 298.79 | 263.51 | 238.35 | 219.25 | 204.11 |
| 11.4 | 7 | 745.31 | 430.31 | 333.31 | 281.70 | 248.44 | 224.72 | 206.71 | 192.44 |
| 13.0 | 6 | 697.17 | 402.51 | 311.79 | 263.51 | 232.39 | 210.21 | 193.36 | 180.01 |
| 15.2 | 5 | 645.46 | 372.66 | 288.66 | 243.96 | 215.15 | 194.61 | 179.02 | 166.66 |
| 18.2 | 4 | 589.22 | 340.19 | 263.51 | 222.70 | 196.41 | 177.66 | 163.42 | 152.14 |
| 22.8 | 3 | 527.01 | 304.27 | 235.69 | 199.19 | 175.67 | 158.90 | 146.17 | 136.07 |
| 30.4 | 2 | 456.41 | 304.27 | 204.11 | 172.51 | 152.14 | 137.61 | 126.58 | 117.84 |
| 45.6 | 1 | 372.66 | 263.51 | 166.66 | 140.85 | 124.22 | 112.36 | 103.36 | 96022 |
| 91.2 | 0 | 263.51 | 215.15 | 117.84 | 99.60 | 87.84 | 79.45 | 73.08 | 68.04 |

FIG. 50B

| C | Cap(pF) | r_s1 | R_MOS | r_s | M | 1 | 2 | 3 | 4 | 5 | 6 | 7 | 8 |
|---|---|---|---|---|---|---|---|---|---|---|---|---|---|
| | 64.6 | 0 | 1.1 | 1.8 | M-1 | 0 | 1 | 2 | 3 | 4 | 5 | 6 | 7 |
| | 32.8 | 0 | .88 | 2.3 | C4 | 0 | 0 | 0 | 0 | 0 | 0 | 0 | 0 |
| | 17 | 0 | .66 | 2.8 | C3 | 0 | 0 | 0 | 0 | 1 | 1 | 1 | 1 |
| | 9.4 | 0 | .44 | 4.2 | C2 | 0 | 0 | 1 | 1 | 0 | 0 | 1 | 1 |
| | 3.7 | 0 | .0001 | 5.6 | C1 | 0 | 1 | 0 | 1 | 0 | 1 | 0 | 1 |
| | | | | | C0 | 1 | 1 | 1 | 1 | 1 | 1 | 1 | 1 |
| Total | | | | | C | 3.7 | 13.1 | 20.7 | 30.1 | 36.5 | 45.9 | 53.5 | 62.9 |

FIG. 51

METHODS AND APPARATUS FOR IMPLEMENTING A RECEIVER ON A MONOLITHIC INTEGRATED CIRCUIT

CROSS-REFERENCES TO RELATED APPLICATIONS

This application claims the benefit of U.S. Provisional Patent Application No. 60/329,797, filed Oct. 16, 2001, entitled "Methods and Apparatus for Implementing A Receiver On A Monolithic Integrated Circuit."

BACKGROUND OF THE INVENTION

1. Field of the Invention

The present invention is directed toward the field of receivers, and more particularly toward integrating an entire receiver on a monolithic integrated circuit.

2. Art Background

In general, televisions include circuits to demodulate radio frequency television signals to generate video and sound signals. The video and sound signals provide the information necessary to form the television picture and sound, respectively. An ultrahigh frequency ("UHF")/very high frequency ("VHF") tuner is one type of circuit found in television receivers. In general, the UHF/VHF tuner receives a radio frequency ("RF") television signal that includes a plurality of channels. The channels are modulated on a carrier frequency. The carrier frequency may be in the UHF spectrum or the VHF spectrum. The television is set or tuned to receive a specific channel (e.g., channel 2). The U/V tuner processes the RF television signal based on the channel selected, and generates an intermediate frequency ("IF") signal. In the United States, the intermediate frequency, used in television receivers, is set to a frequency of 45.75 Mhz.

Television receivers also include circuits to perform intermediate frequency processing. These IF television circuits typically employ surface acoustic wave ("SAW") filters. The SAW filter conditions the IF signal prior to demodulation (i.e., prior to extracting the video and audio signals). The SAW filter rejects or suppresses the energy bands associated with channels adjacent to the desired channel (i.e., the selected channel). To this end, the SAW filter provides a Nyquist slope bandpass response for the IF signal.

Typically, Federal Communications Commission regulations mandate receivers operate at higher intermediate frequencies to reduce EMI emissions from the device. Because of this, prior art television receivers operate at intermediate frequencies of 45.75 MHz. The processing of intermediate frequencies at 45.75 MHz mandates use of an external surface acoustic wave ("SAW") filter (i.e., external to the television tuner integrated circuit). If an external SAW filter is used, radiation emanates from the electrical conductors that couple the integrated circuit tuner to the external SAW filter. Because of this emission of radiation, the receiver must comply with the FCC regulation, and the receiver must process the signals at an intermediate frequency of 45.75 MHz.

It is desirable to develop a television receiver that does not require an external SAW filter. It is also desirable to develop a television receiver implemented on a single integrated circuit chip.

SUMMARY OF THE INVENTION

A monolithic integrated circuit includes a tuner and a SAW filter function. The tuner receives a radio frequency (RF) television signal. The RF television signal comprises a range of fundamental frequencies from 55 mega hertz (Mhz) to 880 Mhz. The tuner down converts the RF television signal to an intermediate frequency (IF) television signal that has a low fundamental frequency. In one embodiment, the SAWF filter, coupled to the tuner, performs the SAW filter function on the IF television signal. In another embodiment, the SAWF filter is implemented at baseband. In one embodiment, the monolithic integrated circuit includes an IF processor for processing the IF television signal to generate a video television signal and an audio television signal.

BRIEF DESCRIPTION OF THE DRAWINGS

FIG. 5 illustrates an example of the triple down conversion for the integrated circuit receiver.

FIG. 31 is a block diagram illustrating one embodiment for the U/V tuner in the television receiver.

FIG. 32 is a block diagram illustrating another embodiment for the U/V tuner.

FIG. 36 is a block diagram illustrating one embodiment for a television tuner that utilizes LC bank filters.

FIG. 38a illustrates one embodiment for an inductive (L) bank for use in the LC filter bank.

FIG. 38b illustrates one embodiment for a capacitive bank for use in the LC filter bank of the present invention.

FIG. 40 shows one embodiment for selecting inductors in an inductor bank from the N code.

FIG. 41 illustrates various resistances for selected inductances of the L bank.

FIG. 44 shows the information for capacitance and M code for selecting capacitors in a C Bank during VHF tuning.

FIG. 45 shows various resistances for selected capacitances of the C bank.

FIG. 47 shows one embodiment for selecting capacitors in a capacitor bank for UHF tuning.

FIGS. 50a and b show the information for selecting inductors in an L Bank during UHF tuning.

FIG. 51 illustrates various resistances for selected capacitances of the C bank.

DETAILED DESCRIPTION

The disclosure of U.S. Provisional Patent Application No. 60/329,797, filed Oct. 16, 2001, entitled "Methods and Apparatus for Implementing A Receiver On A Monolithic Integrated Circuit" is hereby expressly incorporated herein by reference.

A single monolithic integrated circuit chip fully integrates an entire television receiver. In one embodiment, the monolithic integrated circuit includes an ultra high frequency ("UHF") and a very high frequency ("VHF") tuner integrated with a SAW filter function. In other embodiments, the monolithic integrated circuit further incorporates the intermediate frequency ("IF") processing associated with processing television or other types of signals that possess informational content. In one embodiment, the integrated circuit receiver employees a super heterodyne architecture with either double or triple down conversion. The receiver integrated circuit receives the radio frequency ("RF") as a single input, and in turn, generates, as an output, a composite video baseband signal ("CVBs"), AF out, MPX out.

Figure 1:
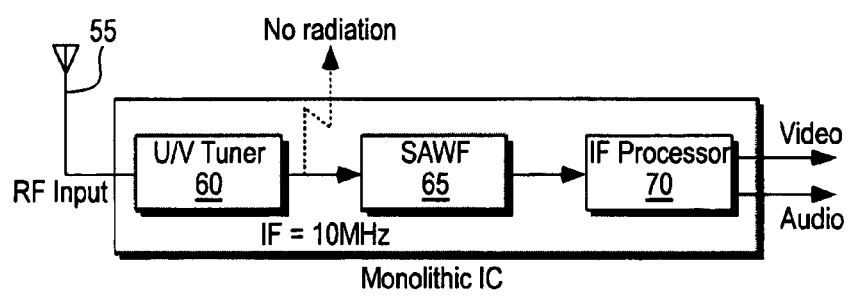
FIG. 1 is a block diagram illustrating one embodiment for the monolithic integrated circuit receiver of the present invention.

FIG. 1 is a block diagram illustrating one embodiment for the monolithic integrated circuit receiver of the present invention. As shown in FIG. 1, the monolithic integrated circuit 50 receives, as input, a television RF signal, and generates, as an output, television video and audio signals. Thus, all functions from receiving the television RF signal to generating the output video and audio components are performed within the monolithic integrated circuit 50. For this embodiment, the monolithic integrated circuit 50 includes an ultra high and very high frequency ("U/V") tuner 60, a SAW filter 65, and an IF processor 70. The U/V tuner down converts the RF television signal to an intermediate frequency television signal. Specifically, the U/V tuner down converts the RF television signal to a fundamental frequency suitable for processing in a SAW filter that is fully integrated in silicon. As used herein, the term "fundamental frequency" connotes the center or carrier frequency for RF or IF signals. For example, if the carrier frequency of an input RF signal is 880 MHz, the fundamental frequency of the signal, which includes a band of signals, is 880 MHz.

In one embodiment, the U/V tuner 60 down converts the RF television signal 55 to a fundamental intermediate frequency of 10 MHz. In another embodiment, the U/V tuner 60 down converts the RF television signal 55 to a fundamental intermediate frequency of 13 MHz. However, other IF frequencies may be used without deviating from the spirit or scope of the invention (e.g., 13 MHz). For example, any IF frequency suitable for SAW filter processing in silicon may be used. The output of the silicon SAW filter 65 is input to the IF processor 70. The IF processor 70 demodulates the IF television signal to recover the video and audio components therein. The functions performed by an IF processor are well-known, and, in fact, the IF processor 70 is intended to represent a broad category of receivers capable of demodulating an IF television signal to recover video and audio components.

The monolithic integrated circuit permits implementing the SAW filter function in silicon because the intermediate frequency has been lowered (e.g., 10 or 13 MHz). Typically, Federal Communications Commission regulations mandate receivers operate at higher intermediate frequencies to reduce EMI emissions from the device. Because of this, prior art receivers operate at intermediate frequencies of 45.75 MHz. The processing of intermediate frequencies at 45.75 MHz mandates use of an external surface acoustic wave ("SAW") filter (i.e., external to the television tuner integrated circuit). If an external SAW filter is used, radiation emanates from the electrical conductors that couple the integrated circuit tuner to the external SAW filter. Because of this emission of radiation, the receiver must comply with the FCC regulation, and the receiver must process the signals at an intermediate frequency of 45.75 MHz.

The monolithic integrated circuit of the present invention does not include input/output (I/O) pins to bring the IF signals of the tuner external to the integrated circuit chip. In addition, because the tuner and SAW filter are integrated into a single monolithic integrated circuit, the monolithic integrated circuit receiver of the present invention does not require external conductors between the integrated circuit tuner and the SAW filter. Therefore, because no radiation emits from the monolithic integrated circuit, the intermediate frequency input to the SAW filter is lowered. This, in turn, permits integrating the SAW filter purely in silicon.

The monolithic integrated circuit receiver incorporates a closed circular alternating generate ("AC") circuit. The closed AC current circuit shields signals propagated on the integrated circuit from emanating external to the integrated circuit. This feature of the integrated circuit also facilitates processing intermediate frequency television signals at frequencies suitable for implementing the SAW filter function in silicon.

Figure 2:
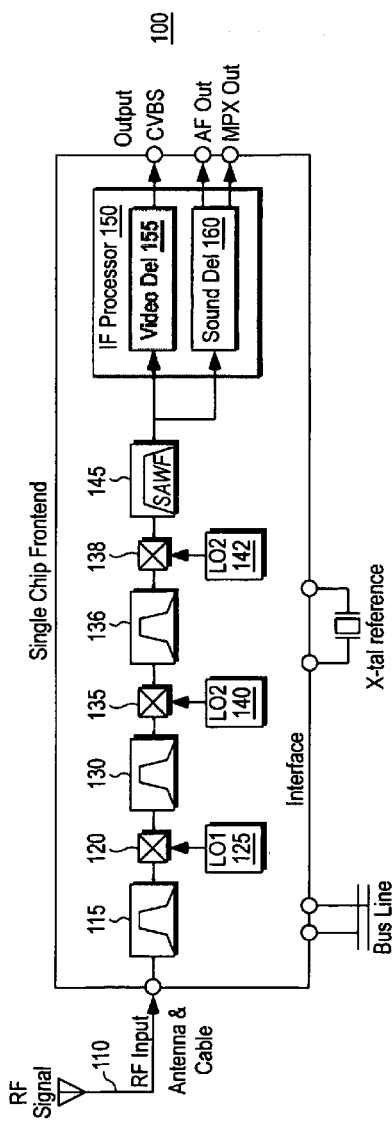
FIG. 2 is a block diagram illustrating one embodiment for the monolithic integrated circuit receiver.

FIG. 2 is a block diagram illustrating one embodiment for the monolithic integrated circuit receiver. As shown in FIG. 2, an RF signal, such as a television signal, is received at an RF input 110 via an antenna or a coaxial cable. The integrated circuit receiver includes a first down conversion circuit, including a filter bank I (115), mixer 120, and a local oscillator 120. The first down conversion circuit converts RF signals, in the upper range of frequencies for the input RF signal, to a first intermediate frequency. A second down conversion circuit, which includes filter bank II 130, mixer 135, and local oscillator 140, converts RF signals in a lower range of frequencies for the input RF signal, as well as further down converts signals from the first intermediate frequency (i.e., signals down converted from the first down conversion circuit) to a second intermediate frequency. For this embodiment of the integrated circuit receiver 100, a third down conversion circuit down converts the second IF signal to a third fixed IF signal prior to IF processing. Specifically, filter bank III 136 and mixer 138 convert the second IF frequency to a third intermediate frequency. In one embodiment, the third intermediate frequency is set to 10 MHz or 13 MHz.

In general, for the down conversion circuits, the signal (i.e., either RF or IF signal) is filtered to attenuate a predetermined band of frequencies. The filtered signal is then input to a mixer, such as a double balance mixer. The double balance mixer includes an RF input, a local oscillator ("LO") input, and an IF output. As is well-known, the mixer generates, at the IF port, a signal with frequency components that include combinations of (RF+LO) and (RF−LO), referred to as first order components, as well as combinations of the first order components with the RF and LO components (second order components). In turn, the first order components, second order components and original RF and LO signals further mix to generate the third order components, etc. The filters in the down conversion circuits (115, 130 and 136) attenuate those components of the mixer output that interfere with the information band of the signal. The IF processor 150, which consists of a video detector 155 and sound detector 160, receives the input from the SAW filter 145. As shown in FIG. 2, the detector 155 generates the VCBS signal, and the sound detector 160 generates the AF out and MPX out signals.

Figure 3:
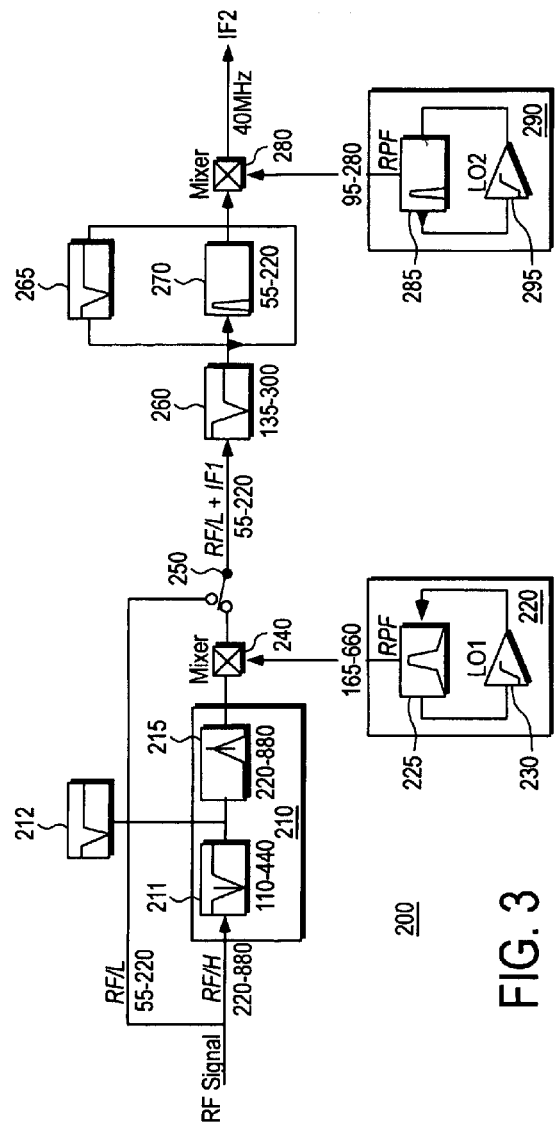
FIG. 3 is a block diagram illustrating one embodiment for the double down conversion in the integrated circuit receiver.

FIG. 3 is a block diagram illustrating one embodiment for the first and second down conversion circuits in the integrated circuit receiver. As shown in FIG. 3, a RF signal is input to the U/V tuner. For this embodiment, the RF television signal has a single fundamental frequency in the range of 55 MHz to 880 MHz. The RF signal frequency range is divided into an upper frequency range ("RF/H") and a lower frequency range ("RF/L"). For this embodiment, the upper frequency range comprises fundamental frequencies between 220 MHz and 880 MHz, and the lower frequency range of RF signals includes fundamental frequencies between 55 MHz and 220 MHz. As described more fully below, the upper frequency range of RF signals is processed differently from the lower frequency range of RF signals.

For this embodiment, a first down conversion circuit includes filter bank I (210), local oscillator circuit 220, and mixer 240. The first down conversion circuit is used to process the upper frequency range of RF television signals (e.g., 220 MHz to 880 MHz). Specifically, the first down conversion circuit down converts the input RF television signal from the range of 220 MHz to 880 MHz to the range of 55 MHz to 220 MHz. This results in a down conversion of 4 to 1. For example, if the input RF television signal comprises a fundamental frequency of 880 MHz, the first down conversion circuit down converts an 880 MHz RF signal to a first intermediate frequency signal of 220 MHz. Similarly, if the input RF signal comprises a fundamental frequency of 220 MHz, then the first down conversion circuit generates a first intermediate frequency signal with a fundamental frequency of 55 MHz.

Figures 4A, 4B:
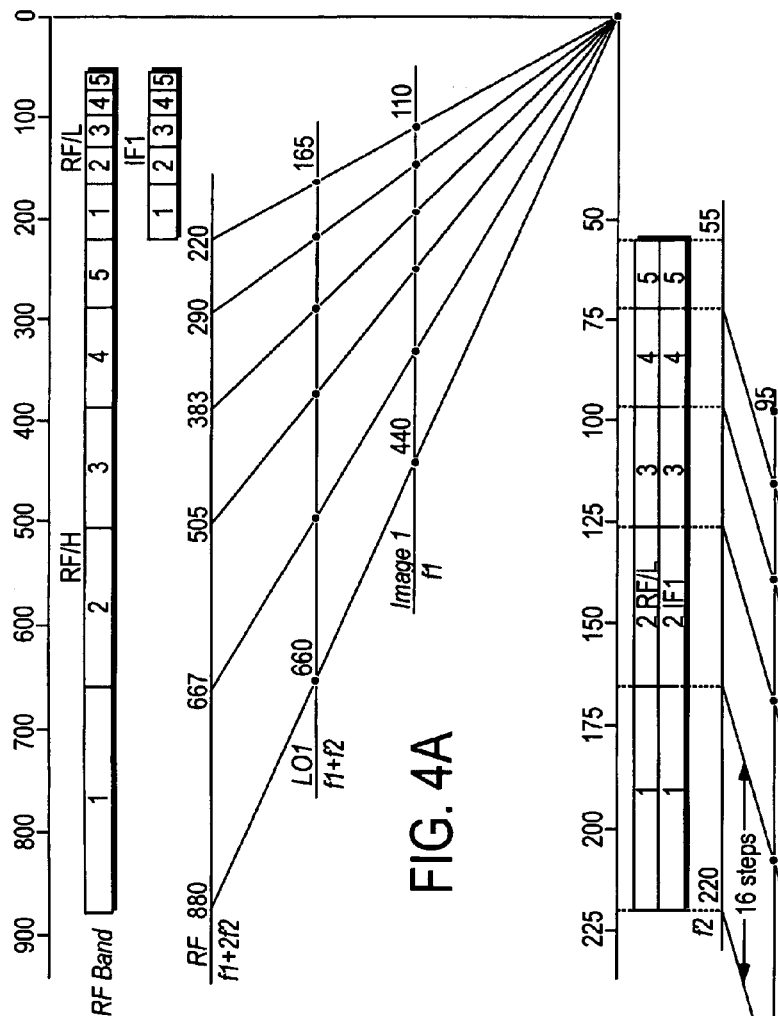
FIG. 4a is a band chart illustrating the first and second down conversion in accordance with one embodiment of the monolithic integrated circuit receiver.
FIG. 4b illustrates a band chart for the second down conversion.

FIG. 4a is a band chart illustrating the first and second down conversion in accordance with one embodiment of the monolithic integrated circuit receiver. As shown in FIG. 4a, the band of frequencies for the RF signal range from 55 MHz to 880 MHz. The RF band is converted to the IF1 band (55 MHz to 220 MHz). In order to convert the range of frequencies, the local oscillator 220 (FIG. 3) generates a variable local oscillator signal. As shown in FIG. 4a, the local oscillator signal has a range of frequencies between 165 MHz and 660 MHz. For example, if the input RF signal has a fundamental frequency of 880 MHz, then the local oscillator 220 is tuned to generate a signal at 660 MHz to produce a first intermediate frequency at the output of mixer 240 of 220 MHz.

The band chart of FIG. 4a also shows a range of frequencies for an image signal, referenced as $f_1$. The image signal, $f_1$, is a product of mixer 240 (i.e., the image signal, $f_1$, results from mixing the RF signal with the local oscillator signal of local oscillator 220). For example, a RF input signal with a fundamental frequency of 880 MHz is mixed with a local oscillator having a frequency of 660 MHz to produce a first harmonic at 220 MHz (RF (880 Mhz)−LO(660 Mhz)=220 Mhz). In turn, this first harmonic, centered around 220 MHz, mixes with the local oscillator frequency of 660 MHz to produce the image at 440 MHz as shown in the band chart of FIG. 4 (220 Mhz+440 Mhz=660 Mhz). The image frequencies require suppression for proper operation of the circuit.

For the embodiment of FIG. 3, the first down conversion circuit includes, as part of filter bank I (210), a notch filter 211, a notch filter 212, and a bandpass filter 215. The band pass filter 215 is tuned based on the input RF signal frequency. For this embodiment, the notch filters 211 and 212 are tuned based on the input channel of the RF signal. For this embodiment, the notch filters 211 and 212 are tuned to filter the RF signal among a range of frequencies between 110 Mhz and 440 Mhz (i.e., the band of frequencies for the image frequency, $f_1$). The notch filters 211 and 212 attenuate the RF signal at the image frequency. The RF signal, output from the notch filters 211 and 212, is input to bandpass filter 215. The bandpass filter 212 is selectively tuned to filter, at a center frequency, between the range of 220 MHz and 880 MHz, the fundamental frequencies of the input RF signals.

FIG. 5 illustrates an example of the triple down conversion for the integrated circuit receiver. The first spectrum of frequencies, label 510 in FIG. 5, illustrates the first down conversion for an example input frequency (e.g., television channel). Specifically, for this example, the RF signal has a center frequency of 800 Mhz, and the local oscillator has a center frequency of 600 Mhz. The RF and LO signals produce an image frequency, $f_1$, centered around 400 Mhz. For this example, the notch filters 211 and 212 (FIG. 3) attenuate the RF signal at a center frequency of 400 Mhz prior to mixing in the mixer 240. The second spectrum of frequencies, label 520 in FIG. 5, illustrates the first down conversion for a second example channel. For the second example, the input RF signal has a center frequency of 400 Mhz, and the local oscillator has a center frequency of 300 Mhz to produce an image frequency centered around 200 Mhz. Thus, for this example, the notch filters 211 and 212 (FIG. 3) are tuned to attenuate the RF signal at a center frequency of 200 Mhz prior to mixing in the mixer 240. Because of the signal attenuation at the center frequency in notch filters 211 and 212, the image component in the first intermediate frequency, output from mixer 240, is suppressed to yield an adequate signal to noise ratio for the signal components.

The output of mixer 240, the first intermediate frequency signal, and the RF input of the integrated circuit are input to a switch 250 (FIG. 3). The switch 250 is configured as a single pole double throw switch. In one embodiment, the switch is controlled from "tuning information" input to the integrated circuit. When the integrated circuit receiver 200 is tuned to process a signal in the upper portion of the RF signal range (e.g., 220 Mhz to 880 Mhz), then switch 250 couples the output of mixer 240 to the second down conversion circuit. Alternatively, when the integrated circuit receiver 200 is tuned to process a signal in the lower portion of the RF signal range (e.g., 55 Mhz to 220 Mhz), then switch 250 couples the input RF signal to the second down conversion circuit. Accordingly, both signals from the lower range of the input RF signal frequencies and the first intermediate frequencies are input to the second down conversion circuit with a range of frequencies (i.e., the input to the second down conversion circuit is variable). This architecture, which generates variable intermediate frequencies, permits using the second down conversion circuit for converting both the first intermediate frequencies and the lower band of input RF signals.

Figure 6:
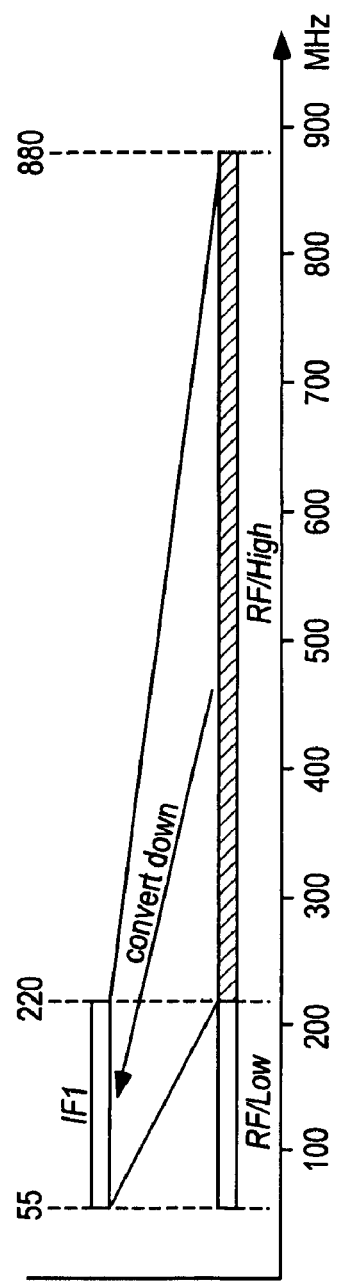
FIG. 6 is a band chart illustrating one embodiment for the variable frequencies input to the second down conversion circuit.

FIG. 6 is a band chart illustrating one embodiment for the variable frequencies input to the second down conversion circuit. As shown in FIG. 6, the upper band of input RF signals, designated as RF/high on FIG. 6, is converted from the range of 880 Mhz–220 Mhz to the first intermediate frequency range of 220 Mhz to 55 Mhz. As shown in FIG. 6, the first intermediate frequency range of 220 Mhz–55 Mhz corresponds to the lower band of input RF signals (i.e., 220 Mhz–55 Mhz).

One embodiment for the second down conversion circuit is shown in FIG. 3. For this embodiment, the down conversion circuit includes, as filter bank II, a tunable notch filter 260, a tunable notch filter 265, a tunable bandpass filter 270, a tunable local oscillator 290 and a mixer 280. The tunable local oscillator 290 further includes a local oscillator 295 and a bandpass filter 285. The second down conversion circuit down converts the band of frequencies of 55 Mhz to 220 Mhz (either the lower band of the RF signal or the first intermediate frequency) to 40 Mhz.

The band chart of FIG. 4b illustrates the second down conversion. Specifically, the band chart illustrates the conversion of frequencies, from either the lower band of input RF signals or the first intermediate frequency, with local oscillator center frequencies that range from 95 Mhz to 260 Mhz. In addition to the desired center frequency of 40 Mhz, the output of mixer 280 (FIG. 3) generates the image spectral components within the range of 135 Mhz to 300 Mhz. The input signal to mixer 280 requires attenuation at the image frequency.

Similar to the first down conversion circuit, the notch filters 260 and 265 are tuned to filter the signal at the image frequency. As illustrated in the band chart of FIG. 4b, the center frequency for the image component ranges between 135 Mhz and 300 Mhz. For example, if the input RF signal has a center frequency of 880 Mhz or 220 Mhz, then the center of the image frequency is 300 Mhz. A bandpass filter 260 is tuned to filter the desired frequency band around the center frequency of the signal input to the filter. For example, if the input RF signal has a center frequency of 880 Mhz or 220 Mhz, the bandpass filter 260 filters the signal around the center frequency of 220 Mhz.

FIG. 5 further illustrates an example of the second down conversion for the integrated circuit receiver. The third spectrum of frequencies, label 530 in FIG. 5, illustrates the second down conversion for an example channel. Specifically, for this example, the input RF or first intermediate frequency, has a center frequency of 200 Mhz, and the local oscillator has a center frequency of 260 Mhz. The RF and LO signals produce an image frequency centered around 300 Mhz. For this example, the notch filters 260 and 265 (FIG. 3) attenuate the IF signal at a center frequency of 300 Mhz prior to mixing in the mixer 280. The fourth spectrum of frequencies, label 540 in FIG. 5, illustrate the second intermediate frequency signal after the second down conversion.

In one embodiment for the integrated circuit receiver, a third down conversion is performed. For this embodiment, the third down conversion circuit comprises filter bank III (136), mixer 138, and local oscillator 3 ("LO3") 142 (FIG. 2). The third down conversion circuit receives the signal at the second intermediate frequency of 40 Mhz. In one embodiment, the third down conversion is performed prior to input to a composite Nyquist filter.

Figure 15:
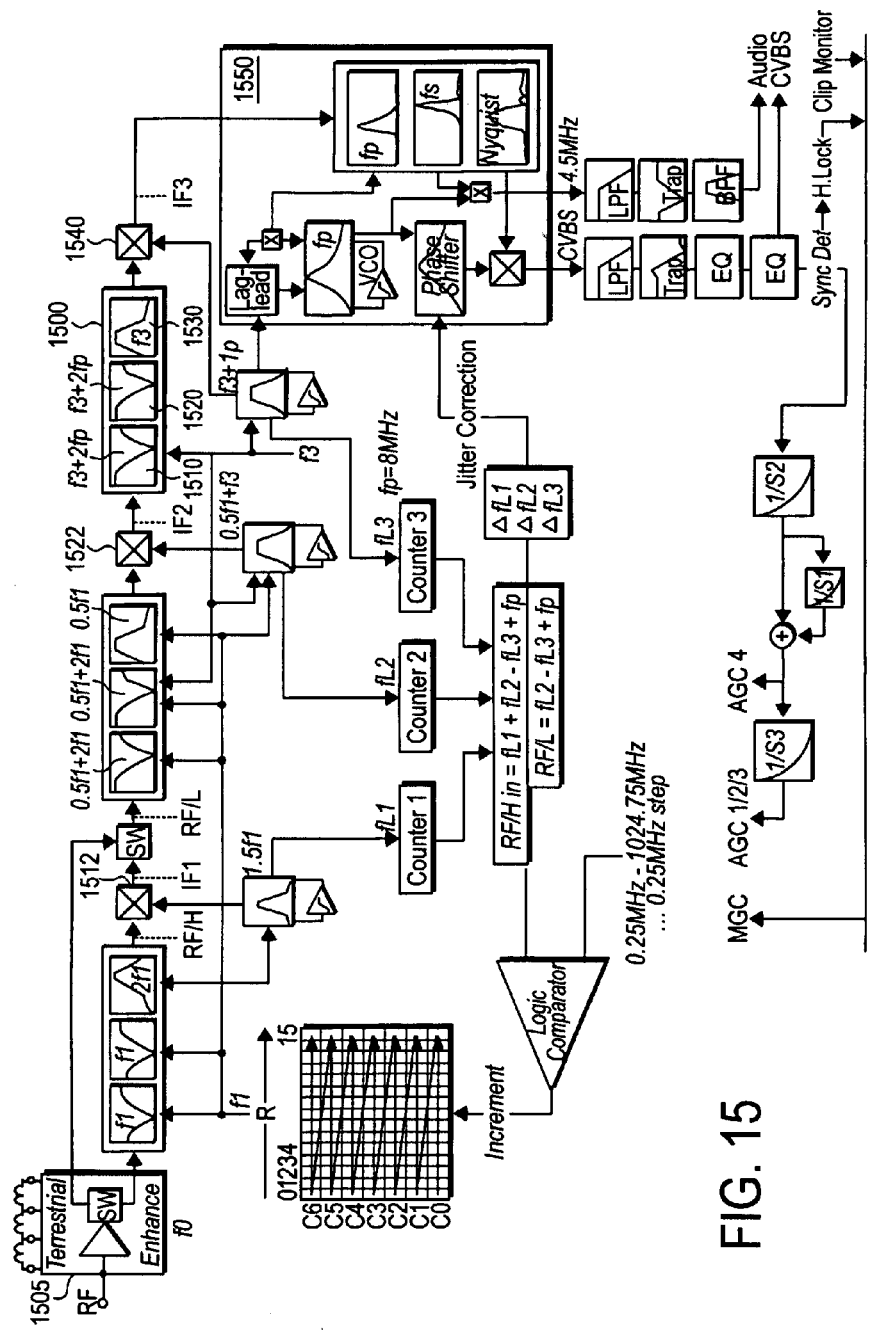
FIG. 15 illustrates one embodiment for controlling gain of the signal in the integrated circuit receiver.

FIG. 15 is a block illustrating one embodiment of the integrated circuit receiver. As shown in FIG. 15, the filter bank 3 receives an IF2 signal, and filters the IF2 signal for input to a third mixer 1540. The filter bank 3 comprises two notch (or trap) filters (1510 and 1520) and a bandpass filter

1530. The two notch filters (1510 and 1520) attenuate the IF2 signal at the "image" frequency, $2f_P+f_3$. As explained below, the $f_3$ frequency compensates for variations in the picture carrier frequency, $f_P$. The third mixer (1540) receives, at the RF input, the filtered IF2 signal, and receives, at the LO input, a local oscillator signal, $f_{3x}+f_P$. The IF output of mixer 1540 generates the IF3 signal, with a fundamental frequency centered around a fixed frequency (e.g., 10 MHz or 13 MHz).

In one embodiment, the third down conversion is performed using two loops. In a first loop, implemented in the composite SAW filter function (described below), a phase error is determined. The phase error measures the phase difference between the picture carrier frequency, $f_P$, extracted from the IF3 signal, and the local $f_P$ frequency generated on the integrated circuit receiver. This phase error, indicated at a "lag-lead" function on FIG. 15, is used in a second loop. The second loop, which includes the VCO of local oscillator, $f_{3x}+f_P$, receives the phase error from the first loop to compensate for frequency variations in the picture carrier frequency, $f_P$. The phase error component is used to adjust the frequency/phase of the local oscillator frequency, $f_{3x}+f_P$. In turn, to complete the second loop, the adjusted local oscillator frequency, $f_{3x}+f_P$, is mixed with the IF2 signal input to mixer 1540 to generate a modified IF3 signal. As a result of the first and second loops, the frequency/phase of the IF2 signal is tracked.

Figure 7A:
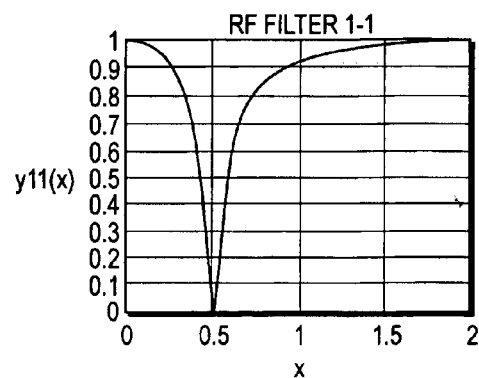
FIG. 7 illustrates the mixing of the second intermediate frequency and a third local oscillator to generate a third intermediate frequency signal.
Figure 7B:
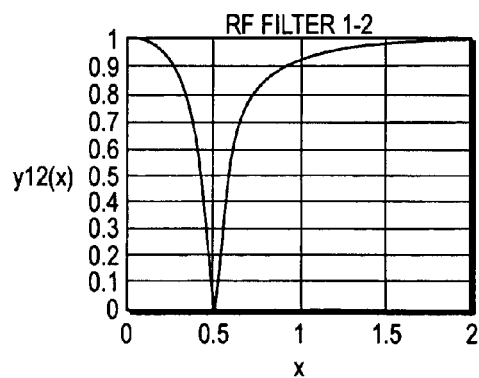
Figure 7C:
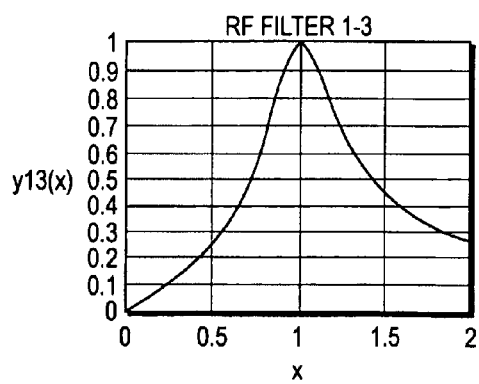
Figure 7D:
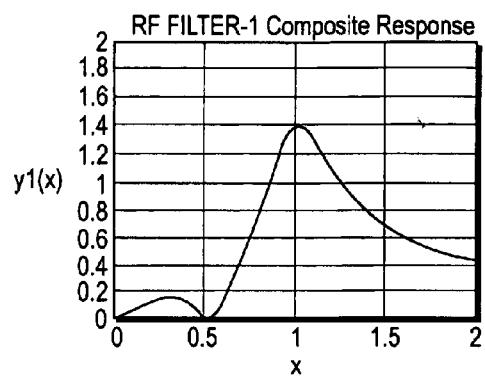
Figure 7E:
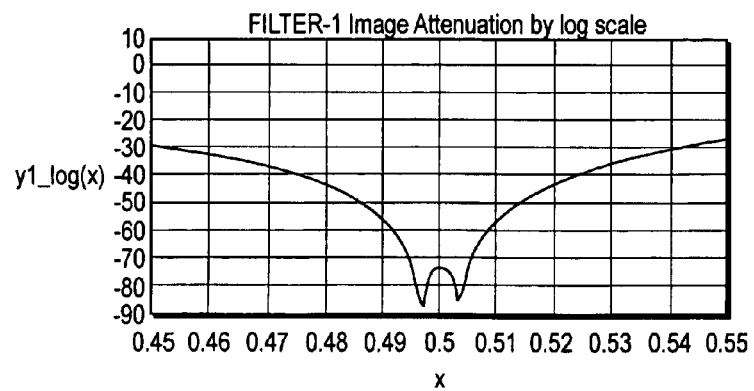

FIGS. 7a–7d illustrate frequency responses for filter bank I 210 (FIG. 3) in accordance with one embodiment of the present invention. The frequency responses for notch filters (211 and 212) are shown in FIGS. 7a and 7b, respectively. The frequency response for bandpass filter (215) is shown in FIG. 7c. The composite response for filter bank 1210 is shown in FIG. 7d, and the RF/H signal attenuation is shown in FIG. 7e.

Figure 7F:
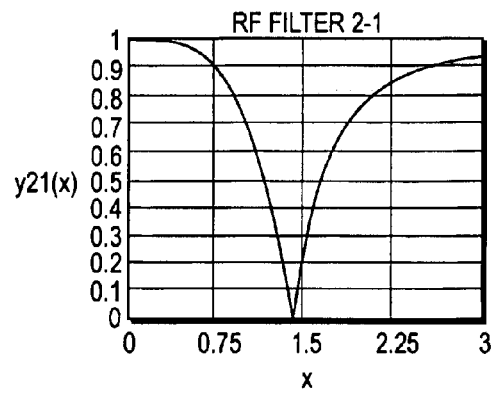
Figure 7G:
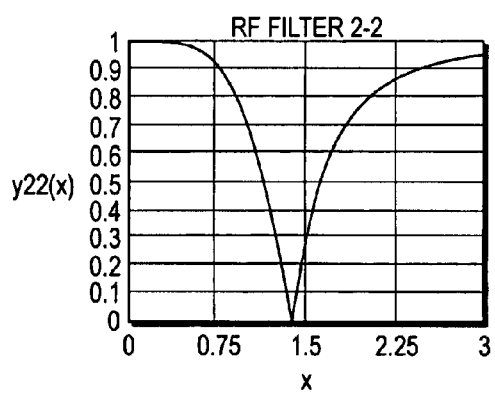
Figure 7H:
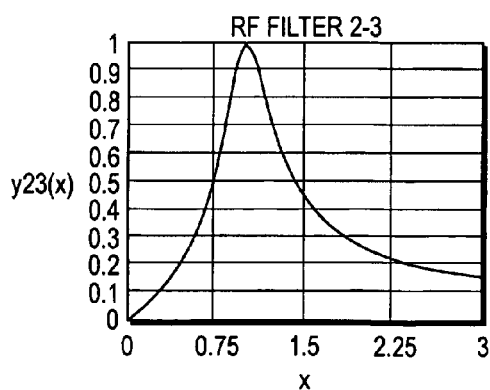
Figure 7I:
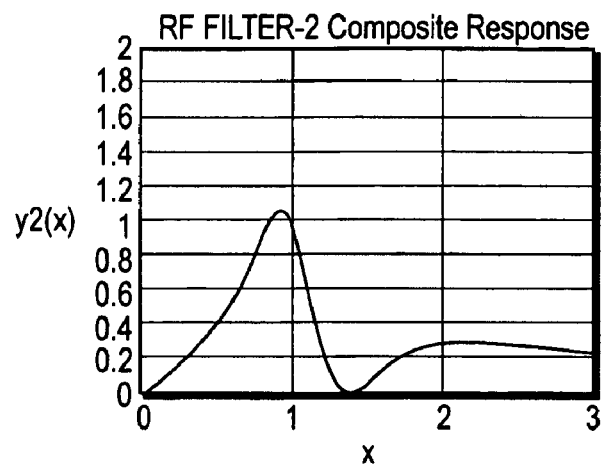
Figure 7J:
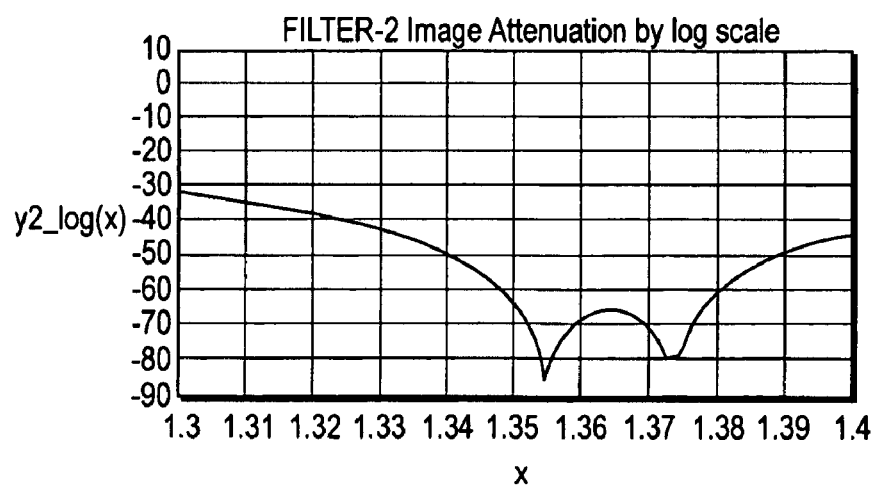

FIGS. 7f–7i illustrate frequency responses for filter bank II (FIG. 3) in accordance with one embodiment of the present invention. The frequency responses for notch filters (260 and 265) are shown in FIGS. 7f and 7g, respectively. The frequency response for bandpass filter (270) is shown in FIG. 7h. The composite response for filter bank II is shown in FIG. 7i, and the RF/L or IF1 signal attenuation is shown in FIG. 7j.

Figure 7K:
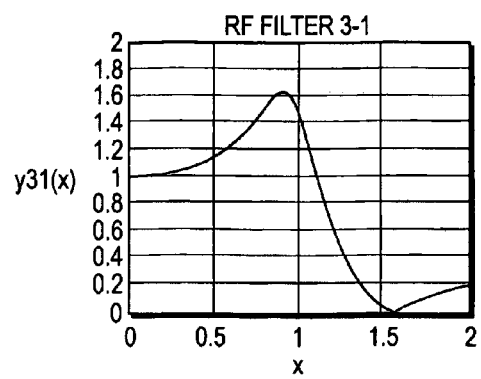
Figure 7L:
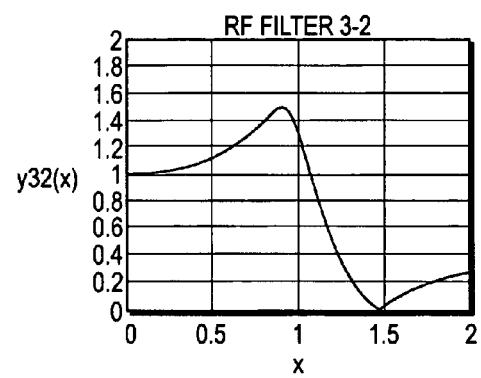
Figure 7M:
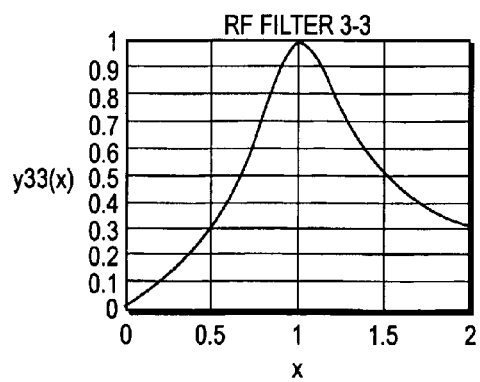
Figure 7N:
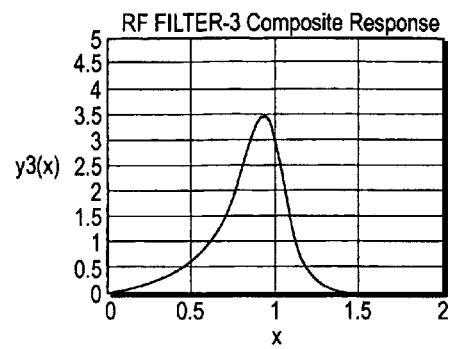
Figure 7O:
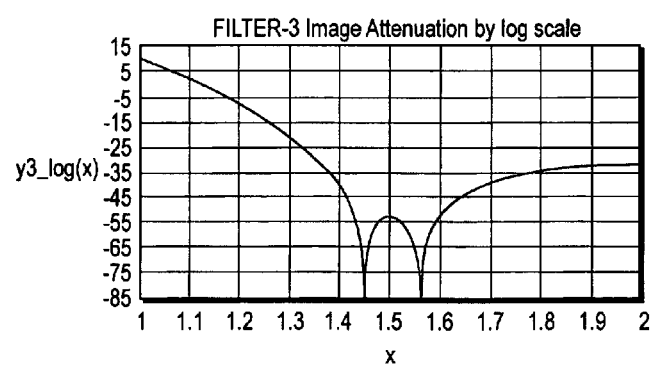

FIGS. 7k–7n illustrate frequency responses for filter bank m (FIG. 15) in accordance with one embodiment of the present invention. The frequency responses for notch filters (1510 and 1520) are shown in FIGS. 7k and 7l, respectively. The frequency response for bandpass filter (1530) is shown in FIG. 7m. The composite response for filter bank III is shown in FIG. 7n, and the IF2 signal attenuation is shown in FIG. 7o.

Figure 8:
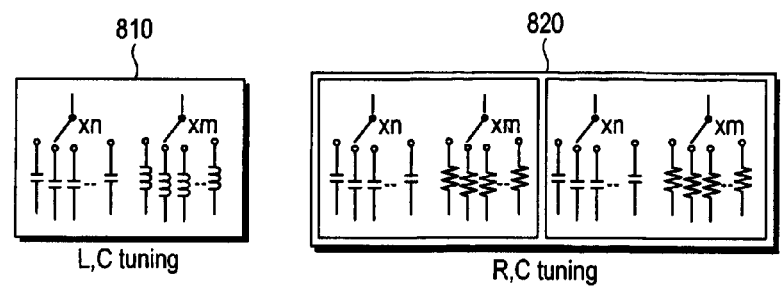
FIG. 8 illustrates one embodiment for implementing discrete filters in the receiver integrated circuit.

Discrete Selectable Filters:

In one embodiment, the tunable or selectable filters (i.e., bandpass filters 215 and 270 and notch filters 211, 212, 260 and 265 (FIG. 3)) are implemented as discrete filters. Specifically, the discrete filters include capacitive, inductive and resistive elements configured for the desired frequency response characteristics. FIG. 8 illustrates one embodiment for implementing discrete filters in the receiver integrated circuit. For this embodiment, the discrete filters include two banks of discrete components: an LC tuning bank 810 and a RC tuning bank 820. As shown in FIG. 8, the tap selection for LC tuning and RC tuning occurs through the $X_n$ and $X_m$ values. In one embodiment, a digital circuit, referred to as CR tap selection circuit, generates the $X_n$ and $X_m$ values based on the channel selected to tune the receiver circuit.

The discrete filters enhance the performance of the tuner circuit. The use of a continuous or active filter requires a power supply voltage (e.g., $V_{cc}$). The power supply voltage exhibits a ripple due to noise on the voltage supply line. This ripple voltage, in turn, causes unacceptable frequency response characteristics on the output of the continuous amplifier. Thus, the use of the discrete or passive filters in the monolithic integrated circuit isolates the signal from ripple voltage, thereby improving signal quality.

Figure 9:
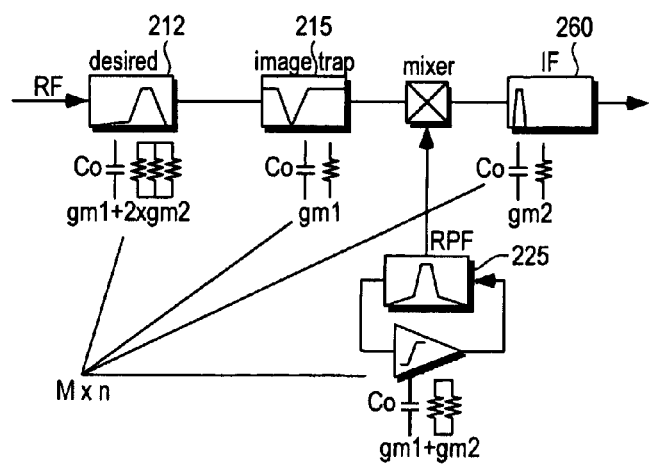
FIG. 9 illustrates one embodiment for configuring the selectable discrete filters in the integrated circuit receiver.

FIG. 9 illustrates one embodiment for configuring the selectable discrete filters in the integrated circuit receiver. For this embodiment, filters 212, 215, 225 and 260 are implemented with a single capacitive value and various combinations of resistive values. The desired combination of resistive values are generated by coupling the resistors in parallel. FIG. 9 depicts the relative combinations of resistive elements with a fixed capacitance for the filters 212, 215, 225 and 260. Specifically, filter 212 has a resistive equivalence of $(gm_1+2gm_2)$, filter 215 has a resistive equivalence of $(gm_1)$, filter 225 has a resistive equivalence of $(gm_1+gm_2)$, and filter 260 has a resistive equivalence of $(gm_2)$.

Figure 10:
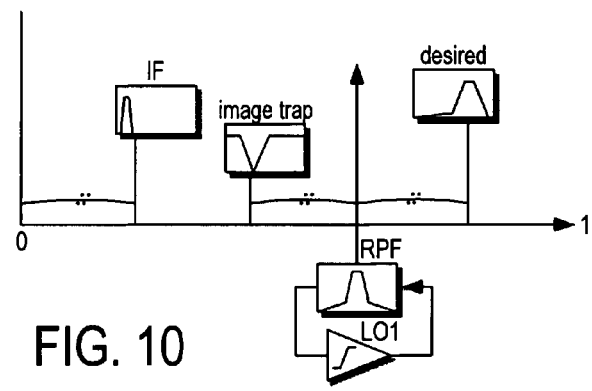
FIG. 10 illustrates the relative tracking among discrete filters.

The selectable discrete filters exhibit a self-aligned tracking architecture. FIG. 10 illustrates the relative tracking among the filters 212, 215, 225 and 260. The self-aligned tracking architecture includes the fixed capacitance for each of the filters (e.g., the $C_0$ capacitance illustrated in FIG. 9). Because the capacitance is fixed among the filters 212, 215, 225 and 260, the tuning of the filters remains relative through selection of the resistive elements. FIG. 10 illustrates this relative tuning for the filters 212, 215, 225 and 260.

Figure 11A:
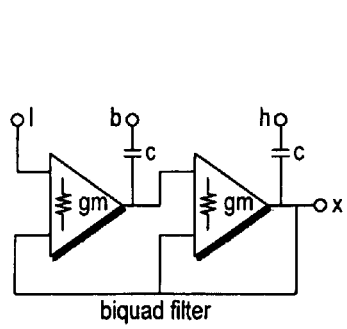
FIGS. 11a and 11b illustrate an equivalent circuit for the discrete filters of the integrated circuit receiver.
Figure 11B:
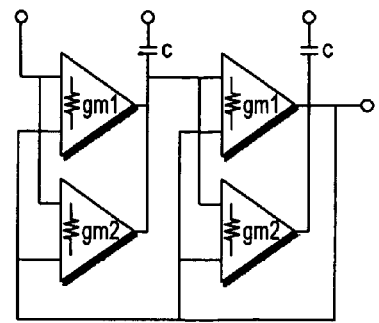

FIGS. 11a and 11b illustrate an equivalent circuit for the discrete filters of the integrated circuit receiver. Specifically, the biquad filter illustrated in FIG. 11a has a frequency response expressed as:

$$f=gm/2\pi C.$$

FIG. 11b illustrates a second equivalent circuit for cascading transconductance elements. The equivalent circuit has a frequency response as follows:

$$f=f1+/-f2=gm1/2\pi C+/-gm2/2\pi C=(gm1+/-gm2)/2\pi C.$$

Accordingly, the frequency response of the resistive elements is generated, as necessary to tune the filter, by adding or subtracting the transconductance values.

Figure 12:
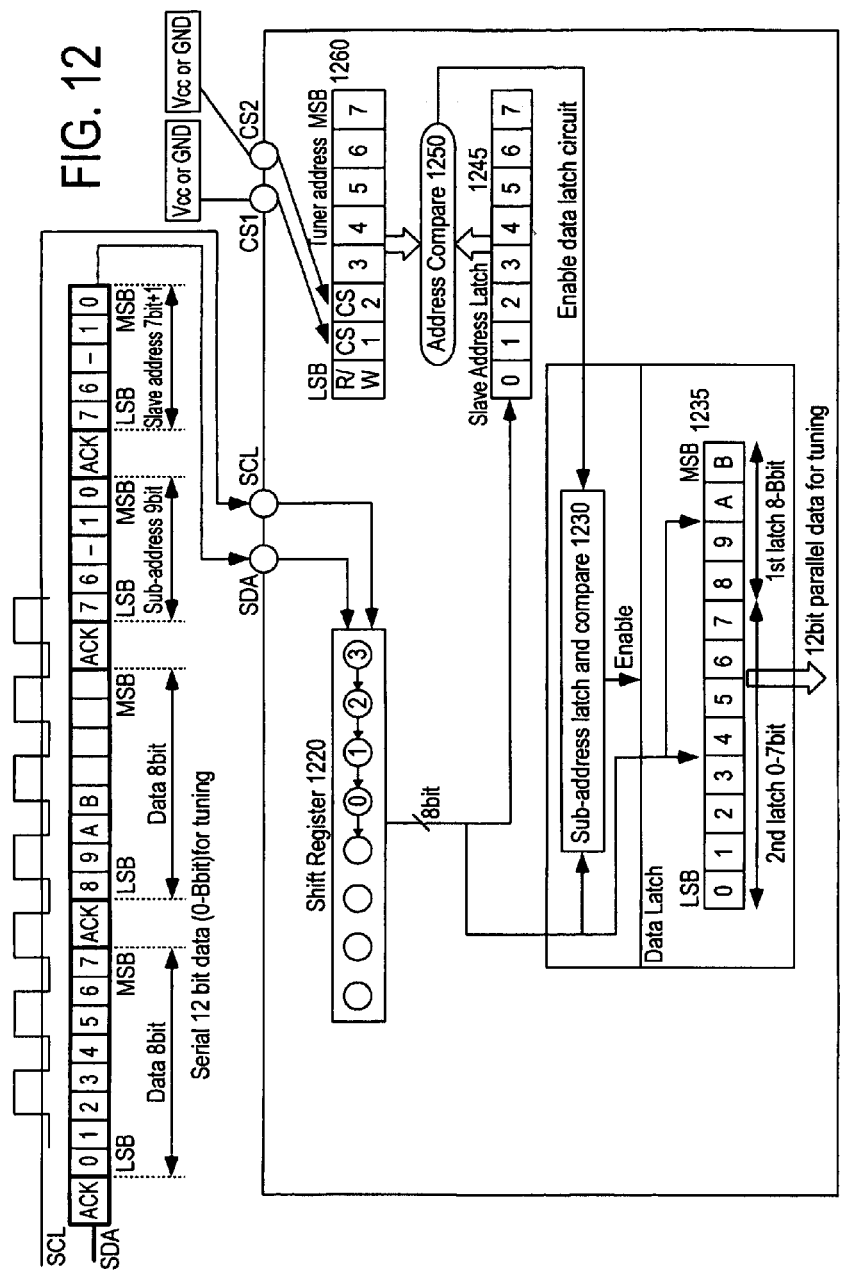
FIG. 12 illustrates one embodiment for the tuner input circuit.

Tuning the Integrated Circuit Receiver:

FIG. 12 illustrates one embodiment for the tuner input circuit 1210 for the receiver. For this embodiment, the integrated circuit receiver interfaces to externals devices, such as a microprocessor, through an IIC bus. For the embodiment shown in FIG. 12, the receiver integrated circuit includes a serial data input/output (I/O) ("SDA") and a serial clock input ("SCL"). For this embodiment, the SDA data includes 28 bits of input data: an eight (8) bit tuner address, an eight (8) bit sub-address, and twelve (12) bits of tuning information. In addition, the SDA data includes, for each 8 bit word, an acknowledge bit ("ACK"). As part of the IIC bus specification, the slave device (e.g., integrated circuit receiver) sets and transmits the ACK bit if the slave device receives the corresponding 8 bit word. The tuner input circuit 1210, through the SDA input, converts the serial SDA data into eight (8) bit words through use of the shift register 1220.

The first eight (8) bits output of the shift register 1220, the tuner address, is input to a slave address latch 1245. A tuner address (e.g., slave address) is used to uniquely identify a device accessible from a bus with a plurality of devices under common control (e.g., a microprocessor or microcontroller controls multiple devices using a common bus). The eight (8) bit tuner address is input to address compare circuit (e.g., comparator) 1250 for comparison to a pre-determined address for the integrated circuit receiver. The pre-determined tuner or slave address, stored in register 1260, is unique for the particular integrated circuit receiver. The chip select 1 and 2 inputs are coupled to the chip select ("CS") bits of register 1260 for receiving external chip select signals. As shown in FIG. 12, the CS inputs consist of either a $V_{cc}$ signal or a ground signal. The CS bits of register 1260, when enabled, set the address in register 1260 to the pre-determined tuner address. The comparator 1250 compares the input address, stored in register 1245, to the predetermined address stored in register 1260. If the addresses match, the address comparator 1250 generates an enable signal. The enable signal is used to enable a sub address latch and compare circuit 1230.

The sub address latch compare circuit 1230 receives, as an input, an eight (8) bit sub address signal output from the shift register 1220 (i.e., the shift register 1220 converts the sub address from a serial bit stream to an 8 bit word). The sub address signal identifies one or more tuner circuits within the integrated circuit receiver. For example, the integrated circuit receiver may incorporate two television tuner circuits to implement a picture in picture function. As shown in FIG. 12, the sub address latch compare circuit 1230, when enabled, generates an enable signal if the eight bit sub address input to the integrated circuit matches with the predetermined sub address stored within the sub address latch and compare circuit 1230 (not shown).

The input tuning circuit of FIG. 12 also includes a data latch 1235 to latch the tuning information for the integrated circuit receiver. As shown in FIG. 12, the SDA data includes sixteen (16) bits of tuning information. The tuning information, input to the SDA, is converted to eight (8) bit words by shift register 1220. In one embodiment, data latch 1235 is implemented with two eight bit latches. The first latch stores the least significant four bits of tuning information, and the second latch stores the most significant eight bits of the tuning information. The data latch 1235 is enabled from the output of the sub address latch and compare circuit 1230 (if the sub address identifies that particular tuner). The data output from data latch 1235 is carried on data bus 1240.

Figure 13:
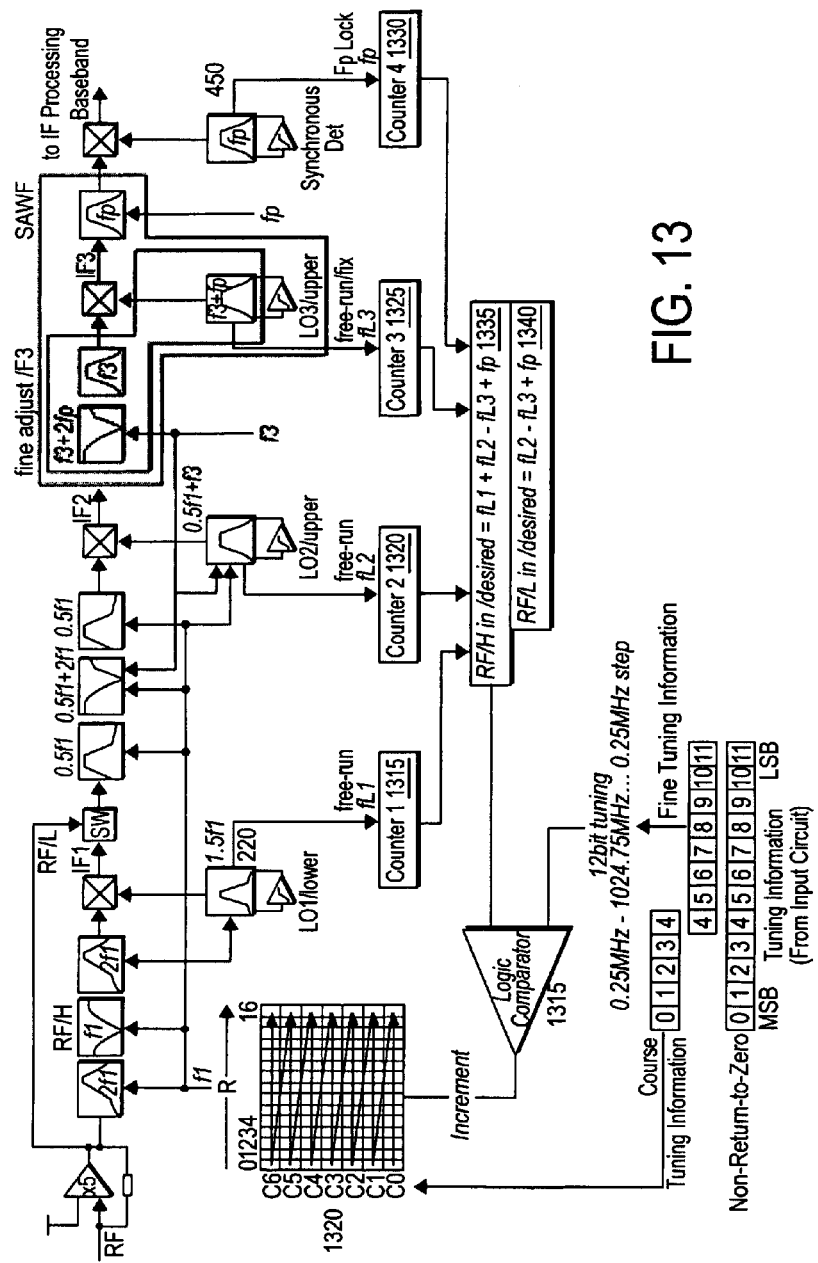
FIG. 13 is a block diagram illustrating one embodiment for tuning the integrated circuit receiver.

FIG. 13 is a block diagram illustrating one embodiment for tuning the integrated circuit receiver. As shown in FIG. 13, the tuning information (e.g., twelve bits), output from input tuning circuit FIG. 12, is input to logic comparator 1315. In one embodiment, the tuning information comprises twelve bits of information. Specifically, for this embodiment, the tuning information specifies a frequency range between 0.25 MHz and 1024.75 MHz, in incremental steps of 0.25 MHz. The second input to logic comparator 1315 is a value indicative of the current frequency tuned in the integrated circuit ("current tuned frequency"). In one embodiment, the current tuned frequency is calculated from the frequency components from various portions of the integrated circuit receiver. For this embodiment, one of two frequency values are calculated depending upon whether the circuit is tuning the high band of RF input signals ("RF/H") or the low frequency band of RF input signals ("RF/L"). The logic comparator 1315 compares the tuning information with the current tuned frequency.

The output of logic comparator 1315 is coupled to a capacitive-resistive ("RC") tap selection circuit 1320. In general, the RC tap selection circuit 1320 generates a capacitive value and a resistive value to tune filters of the receiver. The RC tap selection circuit 1320 increments or decrements the capacitive and resistive values to select the proper capacitive and resistive values for tuning of the integrated circuit receiver filters. For this embodiment, the selection of the capacitive and resistive values is normalized to an image frequency, referred to herein as "$f_1$", of the input RF signal for filter banks I and II. This frequency, $f_1$, defines the center frequency for the response characteristics of the filters in the RF/H and RF/L down conversion circuits (i.e., filter banks I and II).

In one embodiment, the integrated circuit receiver calculates the current tuned frequency of the receiver through the local oscillators in the receiver. For this embodiment, a plurality of counters (1315, 1322, and 1325) are used to generate digital values indicative of a frequency of a corresponding local oscillator. Specifically, local oscillator 220 (first down conversion circuit) is coupled to counter 1315; local oscillator 290 (second down conversion circuit) is coupled to counter 1322; and local oscillator 1345 (third down conversion circuit) is coupled to counter 1325. An RF/H frequency calculation circuit 1335 calculates the current tuned frequency for tuning input signals in the high range of input RF signals, and RF/L frequency calculation circuit 1340 calculates the current tuned frequency for tuning input signals in the low range. In one embodiment, the RF/H frequency calculation circuit 1335 generates the current tuned frequency of the integrated circuit tuner in accordance with the following relationship:

Current Tuned Frequency$_{RF/H}$=$f_{L1}$+$f_{L2}$−$f_{L3}$+$f_P$ wherein, $f_{L1}$ represents the frequency of the local oscillator in the first-down conversion circuit (counter 1315), $f_{L2}$ represents the frequency of the local oscillator in the second down conversion circuit (counter 1322), $f_{L3}$ represents the frequency of the local oscillator in the third down conversion circuit, and $f_P$ represents the picture carrier frequency. Note that the picture carrier frequency, $f_P$, is a fixed frequency. In one embodiment, the RF/L frequency calculation circuit 1340 calculates the current tuned frequency of the integrated circuit tuner in accordance with the following relationship:

Current Tuned Frequency$_{RF/L}$=$f_{L2}$−$f_{L3}$+$f_P$.

The integrated circuit receiver tunes filter banks I and II relative to the $f_1$ frequency. The following expression depicts the relationship between the local oscillator frequencies ($f_{L1}$, $f_{L2}$, $f_{L3}$ and $f_P$) and the input signal "image" frequency, $f_1$, for operation in tuning the high band of RF input signals.

RF/H Tuned Frequency=$f_{L1}$+$f_{L2}$−$f_{L3}$+$f_P$

RF/H Tuned Frequency=1.5$f_1$+0.5$f_1$+$f_3$−$f_3$−$f_P$+$f_P$

RF/H Tuned Frequency=2$f_1$

Thus, as shown by this expression, the tuning of the filters in the first down conversion circuit for operation in the high band of RF input signals results in selection of a center frequency for the bandpass filter (filter bank I) that is twice the image frequency (i.e., center frequency of the bandpass filters is equal to 2$f_1$). The center frequency for the notch filters of filter bank I in the first down conversion circuit equals the image frequency, $f_1$ (i.e., the notch filter attenuates the image frequency).

The following expression depicts the relationship between the local oscillator frequencies and the input signal image frequency for operation in the low band of RF input signals (e.g., the second down conversion circuit).

$$RF/L \text{ Tuned Frequency} = f_{L2} - f_{L3} + f_P$$

$$RF/L \text{ Tuned Frequency} = 0.5f_1 + f_3 - f_3 - f_P + f_P$$

$$RF/L \text{ Tuned Frequency} = 0.5f_1$$

As shown by this expression, the tuning of the filter bank II for operation in the low band of RF input signals selects CR values to tune the bandpass filter at a center frequency ½ the image frequency, $f_1$. The notch frequency (i.e., frequency for attenuation) for the notch filters in the second down conversion circuit may be expressed as:

$$0.5f_1 + 2f_3.$$

In one embodiment, the CR tap selection circuit 1320 selects among 80 discrete values. The 80 discrete values correspond to one hundred and ten (110) television channels. Although this embodiment selects among 80 discrete CR values, any number of discrete CR values may be used without deviating from the spirit or scope of the invention. For this embodiment, the CR tap selection circuit 1320 includes selection of 5 capacitive values, and for each capacitive value, selection of 16 resistive values (i.e., 16 resistive values for each of 5 capacitive values equals 80 CR values).

In one embodiment, a new CR value is incrementally selected for each output of the logic comparator 1315 that indicates an increment to the tuning frequency. The CR tap selection circuit 1320 increments through all of the resistive values before incrementing a capacitive value. This process of incrementing RC values is graphically depicted in FIG. 13. For example, if the current capacitive selection of the CR tap selection circuit is "$C_0$", and the current resistive value selection is "$R_0$", an incremental signal from logic comparator 1315 causes the CR tap selection circuit 1320 to select "$C_0$" as the capacitive value and "$R_1$" as the resistive value. This process of increasing the tuned frequency by selecting the next resistive value, without changing the capacitive value, is repeated until the last resistive value for that capacitive value has been selected (e.g., R15 has been selected for capacitive value C0). When the last resistive value for a corresponding capacitive value has been selected, the CR tap selection circuit 1320 selects the next incremental capacitive value. For example, if the current CR tap selection is "$C_2$" and "$R_{16}$", and the logic comparator 1315 indicates an increment in the tuning frequency, then the CR tap selection circuit 1320 selects "$C_3$" and "$R_0$" as the capacitive and resistive values, respectively.

In one embodiment, the CR tap selection is accomplished through course CR tap selection and fine RC tap selection. As shown in FIG. 13, for this embodiment, the five (5) most significant bits are used to directly select a CR value for tuning. The least significant eight (8) bits of the tuning information are compared to the current tuned frequency to adjust the CR tap selection accordingly. Using this technique, the course tuning information selects a CR tap value directly in the proximity of the desired frequency value, thereby decreasing the amount of time required to lock onto the desired frequency.

Figure 14:
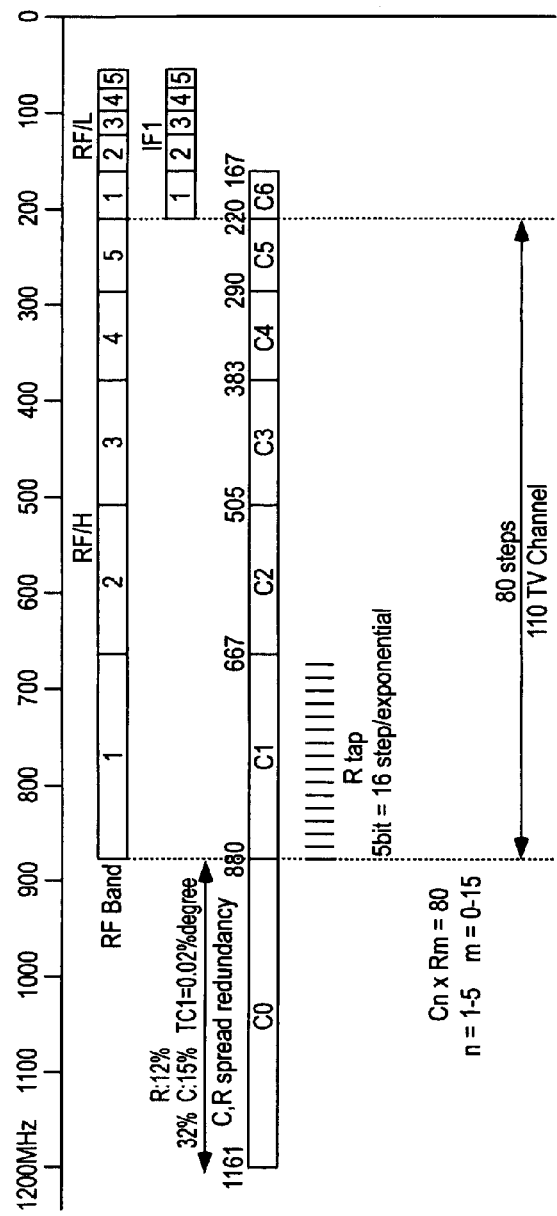
FIG. 14 illustrates a range of capacitor and resistors for tuning the integrated circuit receiver.

FIG. 14 illustrates a range of capacitor and resistors, selectable from the CR tap selection 1320, for tuning the integrated circuit receiver. In one embodiment, the CR tap selection circuit 1320 selects among five capacitive values (e.g., $C_1$–$C_5$) to tune among the 110 television channels. The CR tap selection circuit 1320 does not require manual tuning at the factory to compensate for process variations. In one embodiment, additional capacitive and resistive values, beyond the 80 CR values, are implemented. As shown in FIG. 14, beyond the 80 CR value range, an additional 15 percent of capacitive and 12 percent of resistive values are available for selection for a total redundancy spread of 32 percent. The frequency chart of FIG. 14 shows a correspondence between the frequency of input RF signals and a capacitive value. The chart of FIG. 14 shows that the additional CR values, designated as $C_0$, correspond to RF input frequencies from 880 MHz to 1161 MHz if the circuit fabrication process does not exhibit variation. The $C_6$ capacitive value provides a redundancy at the lower frequency tuning range. Specifically, the $C_6$ capacitive value corresponds to RF input frequencies from 220 MHz to 167 MHz if the circuit fabrication process does not exhibit variation. The CR spread redundancy is sufficient to eliminate the need to tune a filter during manufacturing based on process variations. For example, due to process variations in the integrated circuit fabrication, tuning for an input RF signal of 880 MHz may result in selection of "$C_0$" and "$R_{14}$" (i.e., instead of $C_1$ and $R_0$).

The amount of variation in selection of the CR value varies among different integrated circuits. In one embodiment, the integrated circuit receiver stores the amount of variation in selection of the CR value for subsequent tuning. For this embodiment, the integrated circuit receiver, upon initial power-up, measures the amount of variation in selection of the CR value. For the above example, if tuning for an input RF signal of 880 MHz results in selection of "$C_0$" and "$R_{14}$", then the RC tap selection circuit 1320 compensates accordingly for tuning of other input RF signals.

Automatic Gain Control ("AGC") Circuits:

FIG. 15 illustrates one embodiment for controlling gain of the signal (e.g., television signal) in the integrated circuit receiver. For the embodiment shown in FIG. 15, amplification (e.g., automatic gain control) of the input signal (e.g., television signal) is controlled in four stages. In one embodiment, the input amplifier, 1505 is the first stage of gain for the input signal. In one embodiment, the amount of gain obtained from the input amplifier is externally controlled. For example, the amplification of the input amplifier 1505 may be set by an external microprocessor (not shown). A second stage of gain is obtained in the mixer 1512 if the frequency of the input RF signal is at the high range. A third gain stage, implemented in mixer 1522, is implemented at the second down conversion circuit. The gain of mixers 1512 and 1522, referred to as the "tuner AGC", is set based on the response of a triple order feedback loop. The fourth gain stage is implemented in the IF signal processing (i.e., the phase lock loop for demodulating the picture frequency carrier). The gain of the fourth gain stage, referred to as the "IF AGC", is set based on the response of a second order feedback loop.

Figure 16:
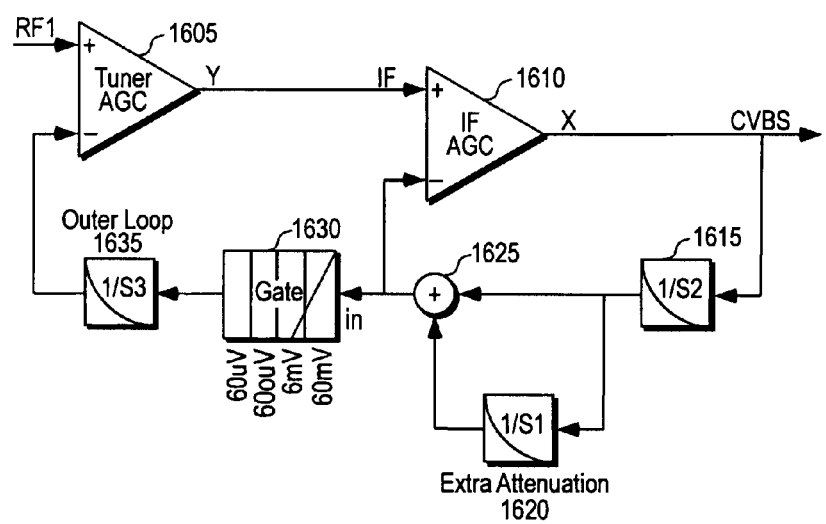
FIG. 16 illustrates equivalent circuits for the second and third order feedback loops in accordance with one embodiment for implementing AGC in the integrated circuit receiver.

FIG. 16 illustrates equivalent circuits for the second and third order feedback loops in accordance with one embodiment for implementing AGC in the integrated circuit receiver. Amplifiers 1605 and 1610 are shown for generating gain for the tuner AGC and IF AGC functions, respectively. The second order loop for the IF AGC function consists of the elements "1/S2" and "1/S1" and adder 1625. Specifically, the gain at the output of amplifier 1610, x, may be expressed as:

$$x = S1 * S2 / (I + S1 + (S1 * S2)).$$

The third order loop for the tuner AGC function consists of, in addition to the second order loop elements of the IF AGC, a look-up table 1630 and the element "1/S3." The output gain of amplifier 1615, x, as a result of the third order loop, may be expressed as:

$$x = S1*S2*S3/1 + (S1+S3) + S1*S3 + S1*S2*S3.$$

If the AGC function is essentially a Butterworth response such that S3=2*S1 and S2=0.5*S1, then the response function, x, as a result of the third order loop, may be simplified to:

$$x = S1**3/(1 + 3*S1 + 2*S12 + S13)$$

Figure 17:
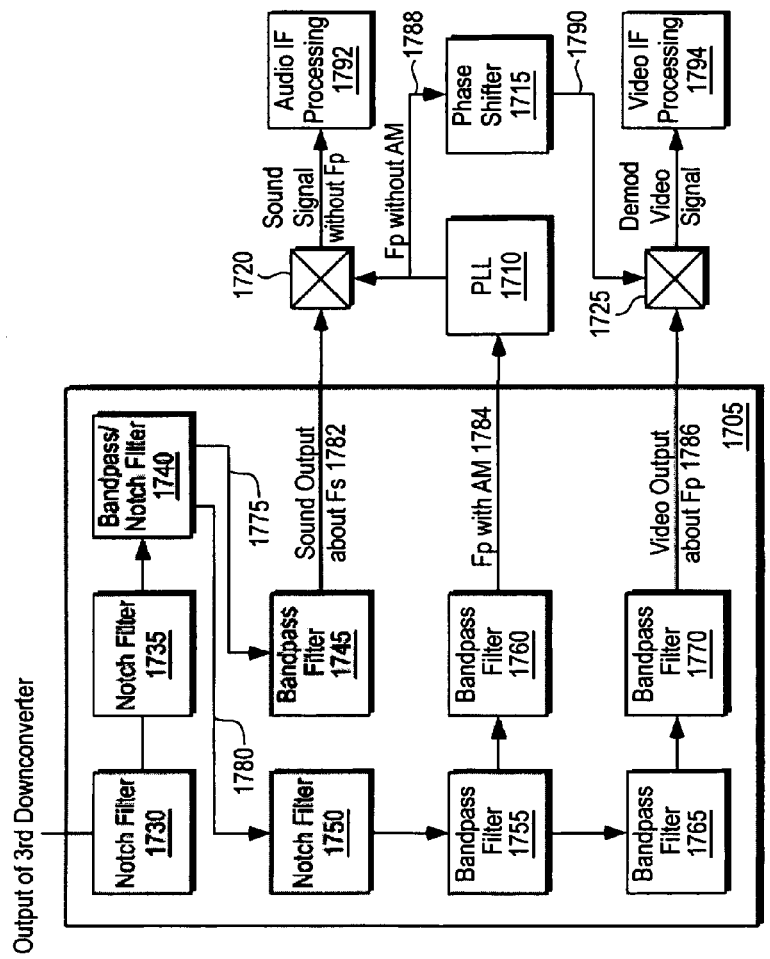
FIG. 17 illustrates a more detailed view of a Nyquist filter 1705 that is used in some embodiments of the invention.

FIG. 17 illustrates a more detailed view of a Nyquist filter 1705 that is used in some embodiments of the invention. This figure also illustrates the PLL 1710, phase shifter 1715, sound demodulator 1720, video demodulator 1725, audio IF processing 1792, and video IF processing 1794, which all follow the Nyquist filter 1705. In the description below, the Nyquist filter is initially described for processing NTSC signals. The use of this filter for processing other signal types (e.g., CCIR) is explained after this initial discussion.

The Nyquist filter receives the output from the third-stage down conversion. This output includes all the signals of the desired channel and centers around 10 MHz, as described above. All the signals of the desired channel are in a 6 MHz band. Specifically, in the United States, the channel bandwidth is fixed at 6 MHz with (1) the picture carrier ($F_P$) located 1.25 MHz from the lower end of the band, (2) a sound carrier ($F_S$) placed 4.5 MHz above the picture carrier frequency, and (2) the color sub-carrier ($F_{SC}$) positioned 3.58 MHz above the picture carrier frequency. The picture carrier is amplitude modulated by a baseband video signal while the sound carrier is frequency modulated.

The Nyquist filter 1705 performs several operations. First, it rejects out of band adjacent channels (e.g., $F_{P+}$ and $F_{P-}$) in the signal that it receives from the third down converter. It also generates a Nyquist slope used for demodulating the video signal. It also extracts the picture signal content (i.e., the signals about the picture carrier $F_P$ and the color sub-carrier $F_{SC}$) and the sound signal content (i.e., the signal about the sound carrier $F_S$).

As shown in FIG. 17, the Nyquist filter includes nine filters. Some of these filters are notch (also called trap) filters while others are bandpass filters. Each of these filters is implemented as a biquad filter, similar to the biquad filters that were described above by reference to FIGS. 11a and 11b.

Figure 18:
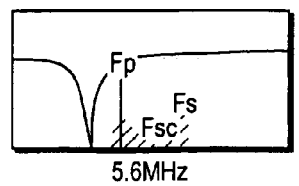
FIG. 18 provides the output response of a portion of a Nyquist filter.
Figure 19:
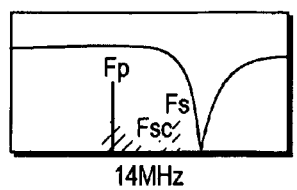
FIG. 19 provides the output response of a portion of a Nyquist filter.

The first two filters 1730 and 1735 are boundarization filters that are designed to define the initial boundaries of the channel. Specifically, trap filter 1730 receives the signal from the third down converter. This filter defines the lower boundary of the channel, as illustrated by FIG. 18 which provides the output response of filter 1730. The trap filter 1735 then defines the upper boundary of the channel, as illustrated by FIG. 19 which provides the output response of filter 1735.

Figure 20:
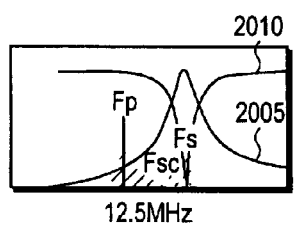
FIG. 20 illustrates a frequency response for a bandpass filter component and a frequency response for a notch filter component.

The next filter 1740 is a bandpass filter and a trap filter. In other words, it receives the output of the second filter and produces two outputs. The first output 1775 is a bandpass-filtered version of the second filter's output, while the second output 1780 is a notch-filtered version of the second filter's output. FIG. 20 illustrates a frequency response 2005 for the bandpass filter component of filter 1740, and a frequency response 2010 for the notch filter component of filter 1740. The bandpass filtering of filter 1740 is designed to attenuate the picture carrier ($F_P$). On the other hand, the trap filtering of filter 1740 is for removing the sound carrier ($F_S$).

Figure 21:
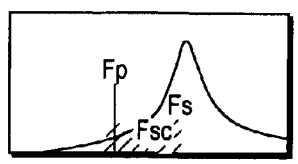
FIG. 21 illustrates the frequency response of the bandpass filter.
Figure 22:
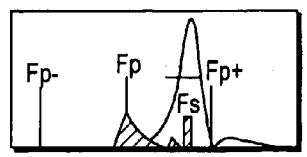
FIG. 22 illustrates a passband that is a composite of the frequency response of multiple filters.

As shown in FIG. 17, the bandpass filter 1745 receives the bandpass-filtered output of filter 1740. FIG. 21 illustrates the frequency response of the bandpass filter 1745. As can be seen from FIG. 21, this filter 1745 further attenuates the picture carrier ($F_P$), in order to obtain a passband signal that includes the sound signal about the sound carrier ($F_S$). This passband is illustrated in FIG. 22, and it is a composite of the frequency response of filters 1730, 1735, 1740, 1745. This passband signal is supplied to the sound detector 1720, which will be further described below.

Figure 23:
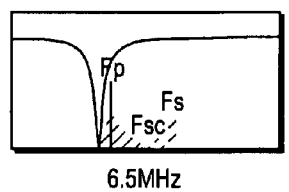
FIG. 23 illustrates the frequency response of a notch filter.

As illustrated in FIG. 17, the notch filter 1750 receives the notch-filtered output 1780 of filter 1740. FIG. 23 illustrates the frequency response of the notch filter 1750. As can be seen from FIG. 23, this filter 1750 defines the lower boundary of the channel's video component. This follows the notch filtering operation of the filter 1740, which defined the upper boundary of the channel's video component.

Figure 24:
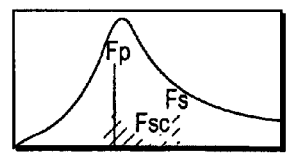
FIG. 24 illustrates the frequency response of a bandpass filter.
Figure 25:
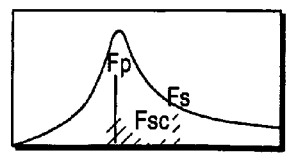
FIG. 25 illustrates the frequency response of a bandpass filter.

The bandpass filter 1755 receives the output of the filter 1750. FIG. 24 illustrates the frequency response of this bandpass filter. The bandpass filter 1760 receives the output of filter 1755. FIG. 25 illustrates the frequency response of this bandpass filter 1760. The frequency output characteristics of bandpass filters 1755 and 1760 sharpen the frequency response about the picture carrier ($F_P$).

Figure 26:
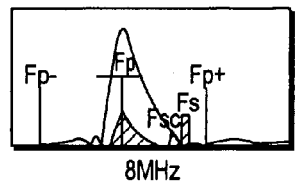
FIG. 26 illustrates the frequency characteristics of the Nyquist filter.

FIG. 26 illustrates the frequency characteristics of the output 1784 of the filter 1760. This frequency characteristic is a composite of the frequency response of filters 1730, 1735, 1740, 1750, 1755, and 1760. As illustrated in FIG. 26, the passband output signal 1784 is sharply centered about the picture carrier ($F_P$). This signal is supplied to the phase-lock-loop circuit 1710, which will be further described below.

Figure 27:
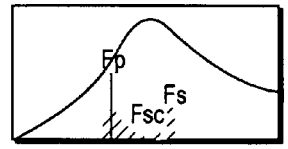
FIG. 27 illustrates the frequency response of a bandpass filter.
Figure 28:
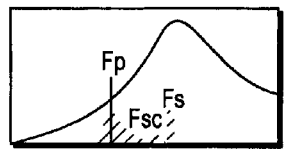
FIG. 28 illustrates the frequency response of a bandpass filter.

The bandpass filter 1765 also receives the output of filter 1755. FIG. 27 illustrates the frequency response of this bandpass filter. The bandpass filter 1770 receives the output of filter 1765. FIG. 28 illustrates the frequency response of this bandpass filter. The frequency output characteristics of bandpass filters 1765 and 1770 ensure that the output 1786 of filter 1770 has the appropriate Nyquist slope, and relatively flatten the frequency response of this output 1786 about the approximate 3.58 MHz bandwidth that contains the picture and the color sub-carrier signals.

Figure 29:
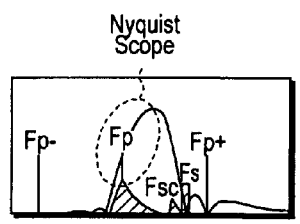
FIG. 29 illustrates the frequency characteristics of a portion of the Nyquist filter.

FIG. 29 illustrates the frequency characteristics of the output 1786 of the filter 1770. This frequency characteristic is a composite of the frequency response of filters 1730, 1735, 1740, 1750, 1755, 1765, and 1770. This output signal provides (1) video content of the signal about the picture and the color sub-carrier frequencies, and (2) provides the Nyquist slope, which is circled in FIG. 29. This signal is supplied to the video detector 1725, which will be further described below.

As mentioned above, the PLL receives the output of the bandpass filter 1760. This output includes the picture carrier ($F_P$) with amplitude modulation. The PLL extracts the amplitude demodulation to obtain the picture carrier signal ($F_P$). As known in the art, the PLL can be formed by a voltage controlled oscillator, a mixer, and a lag-lead circuit.

The PLL's output, i.e., the picture carrier signal, is then supplied to the sound detector 1720 and phase shifter 1715. The sound detector uses this carrier signal to extract the picture carrier signal ($F_P$) from the sound output signal 1782 that it receives from the bandpass filter 1745. This detector needs to extract the picture carrier signal ($F_P$) because the output signal 1782 still has some video signal components. The sound detector 1720 completely eliminates such spurious video components in the sound signal 1782. The output of the sound detector is then supplied to the audio IF processing 1792, which will be further described below.

The phase shifter shifts the phase of the picture carrier signal ($F_P$) 1788, so that the picture carrier signal ($F_P$) and the video output signal 1786 are in phase. The amount of the phase shift is equal to the phase shift introduced in the video output signal 1786 by filters 1765 and 1770. Once the phase-shifted output of the shifter 1715 is then supplied to the video detector.

The video detector 1725 then uses the received phase-shifted output 1790 and the received video output signal 1786 to remove the high frequency picture carrier signal and obtain the video signal. The Nyquist slope of the video output signal provides a linear attenuation that converts the picture signal from a vestigial sideband signal to one which is equivalent to a single sideband with a carrier. In this manner, the frequency response of the signal after demodulation is flat over the video bandwidth.

As shown in FIG. 17, the output of the video detector is supplied to video IF processing circuitry 1794. Video IF processing entails several operations, some of which are eliminating aliasing due to the video detector 1725, and compensating for group delay introduced by the Nyquist filter. As techniques for performing these operations are known in the art, they will not be described further in order not to obscure the description of the invention with unnecessary detail.

Also, as illustrated in FIG. 17, the output of the audio detector 1720 is supplied to audio IF processing circuitry 1792. Audio IF processing entails several operations, some of which are narrowing the bandwidth about the FM audio signal, and performing frequency demodulation to obtain the audio content. As techniques for performing these operations are known in the art, they will not be described further in order not to obscure the description of the invention with unnecessary detail.

The Nyquist filter 1705 can also be used for CCIR signals. Each channel in a CCIR-scheme is 8 MHz. In some embodiments that operate for CCIR signals, the Nyquist filter receives a third downconverter's output that is centered around 13.33 MHz. To adjust the center frequency of the Nyquist filter's biquad filters to be around 13.33 MHz, some embodiments increase the biasing current in each biquad filter by 33.33%. This increase adjusts the $g_m$-value of each filter, which, in turn, adjusts the filter's center frequency.

Also, the intercarrier spacing is different for different countries that use CCIR. The spacing between the picture carrier signal ($F_P$) and the sound carrier signal ($F_S$) is 5.5 in some countries, 6.0 in other countries, and 6.5 in yet other countries. Some embodiments of the invention adaptively modify the filter characteristics of 1740, 1745, and 1750 to account for these variations in intercarrier signal spacing. Some of these embodiments adaptively modify each filters characteristics by switchably selecting different banks of capacitors as the filters capacitors.

Figure 30:
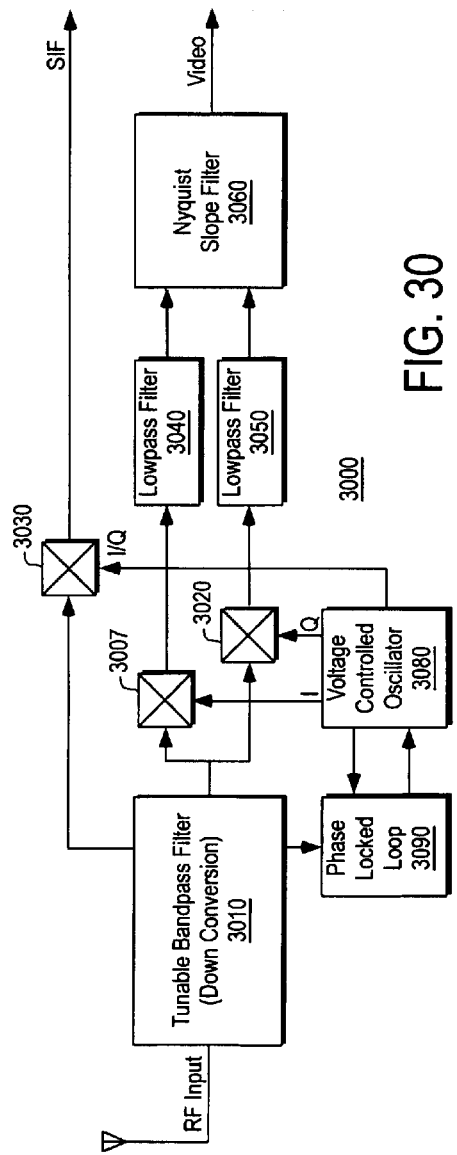
FIG. 30 is a block diagram illustrating one embodiment for a receiver that incorporates the filter of the present invention.

Quadratic Nyquist Slope Filter:

FIG. 30 is a block diagram illustrating one embodiment for a receiver that incorporates the filter of the present invention. A receiver circuit 3000 receives, as an input, a radio frequency ("RF") television signal, and generates, as outputs, a baseband video signal ("video") and an IF sound signal ("SIF"). In general, receiver 3000 includes a downconverter/tunable filter 3010 to convert the RF television signal to an IF signal. The receiver 3000 also includes a demodulator circuit to demodulate the IF signal to generate the video and SIF signals.

For this embodiment, the down conversion function is performed by downconverter 3010, phase locked loop 3090, and voltage controlled oscillator 3080. In general, downconverter 3010 converts the RF input signal to an IF signal through use of the voltage controlled oscillator 3080. The phase locked loop 3090 locks the phases of the input RF signal to the phase of the local oscillator signal.

If receiver 3000 employs a direct demodulation scheme, downconverter 3010 is replaced with a tunable bandpass filter. In general, in a direct demodulation scheme, the RF signal is directly demodulated (i.e., the input to the demodulator is the filtered RF signal). The tunable bandpass filter 3010 filters the RF signal for the tuned channel of receiver 3000.

The IF signal or RF signal for the direct demodulation embodiment, output from the tunable bandpass filter/downconverter 3010, is input to the RF ports of mixers 3007 and 3020. As shown in FIG. 30, voltage controlled oscillator 3080 generates two signals: an in-phase local oscillator signal ("I") and a quadrature phase local oscillator signal ("Q"). The Q signal is phase shifted 90 degrees from the I signal. The mixers 3007 and 3020 generate a baseband signal from the intermediate frequency television signal and the I/Q local oscillator signals at both in-phase and quadrature phases.

The demodulator portion of receiver 3000 also includes mixer 3030 to extract the sound intermediate frequency carrier ("SIF"). As shown in FIG. 30, the conditioned RF input signal (direct demodulation) or the downconverted IF signal is input to an RF port on mixer 3030. The voltage controlled oscillator 3080 is coupled to mixer 3030 to drive the LO port. The mixer 3030 mixes the conditioned RF/downconverted IF signal and local oscillator signal to generate the sound intermediate frequency signal as an output component.

As shown in FIG. 30, the demodulator portion of the receiver also includes low pass filters (3040 and 3050) as well as Nyquist slope filter 3060. As described more fully below, the total response from low pass filters (3040 and 3050) and Nyquist slope filter 3060 generate a demodulated baseband television signal. Specifically, the Nyquist slope filter generates a Nyquist slope response and rejects channels adjacent to the tuned channel.

FIG. 31 is a block diagram illustrating one embodiment for the U/V tuner (U/V tuner 3010, FIG. 30) in the television receiver. For this embodiment, U/V tuner 3010 performs a double down conversion. As shown in FIG. 31, an RF television signal is input to the U/V tuner. The RF television signal has a single fundamental frequency in the range of 55 MHz to 880 MHz. For this embodiment, a first down conversion circuit includes tunable bandpass filters 3110 and 3130, automatic gain control ("AGC") circuits 3120 and 3140, local oscillator circuit 3145, and mixer 3150. The first down conversion circuit processes the RF television signal to convert the signal to a first intermediate frequency of 45.75 MHz (i.e., down converts from a range of input frequencies, 55 MHz to 880 MHz, to the first IF frequency of 45.75 MHz). For example, if the input RF television signal comprises a fundamental frequency of 880 MHz, the first down conversion circuit down converts an 880 MHz RF signal to a first intermediate frequency signal of 45.75 MHz. Similarly, if the input RF signal comprises a fundamental frequency of 220 MHz, then the first down conversion circuit generates a first intermediate frequency signal of 45.75 MHz.

A band of RF frequencies is converted to the first IF. In order to convert the range of frequencies, the local oscillator 3145 (FIG. 31) generates a variable local oscillator signal. The local oscillator signal has a range of frequencies between 925.75 MHz and 100.75 MHz. For example, if the input RF signal has a fundamental frequency of 880 MHz, then the local oscillator 3145 is tuned to generate a signal at 925.75 MHz to produce a first intermediate frequency at the output of mixer 3150 of 45.75 MHz (i.e., 925.75 MHz–880 MHz).

An image signal, $f_1$, is an output product of mixer 3150 (i.e., the image signal, $f_1$, results from mixing the RF signal with the local oscillator signal of local oscillator 3145). For example, an RF input signal with a fundamental frequency of 55 MHz is mixed with a local oscillator having a frequency of 100.75 MHz to produce a first harmonic at 45.75 MHz (RF(100.75 Mhz)–LO(55 Mhz)=45.75 Mhz). In turn, this first harmonic, centered around 45.75 MHz, mixes with the local oscillator frequency of 100.75 MHz to produce an image at 155.75 MHz (45.75 Mhz+100.75 Mhz=155.75 Mhz). The image frequencies require suppression for proper operation of the circuit.

For the embodiment of FIG. 31, the first down conversion circuit includes tunable bandpass filters 3110 and 3130. The band pass filter 3110 is tuned based on the input RF signal frequency. The bandpass filter 3130 is selectively tuned to filter, at a center frequency, between the range of 55 MHz and 880 MHz, the fundamental frequencies of the input RF signals.

A second down conversion circuit, which includes IF bandpass filter 3160, AGC circuit 3170, mixer 3180, and local oscillator 3175, converts RF signals from the first intermediate frequency (45.75 MHz) to a second intermediate frequency (10.5 MHz). The IF2 composite filter 3185 processes the IF2 television signal for extraction of the tuned channel sound carrier ($F_s$) and the tuned channel picture carrier ($F_P$). An AGC circuit 3190 provides additional gain for the color carrier frequency.

FIG. 32 is a block diagram illustrating another embodiment for the U/V tuner. For this embodiment, the U/V tuner (3010, FIG. 30) utilizes a single down conversion scheme. For this embodiment, a single down conversion circuit includes tunable bandpass filters 3210 and 3220, automatic gain control ("AGC") circuits 3215, 3225, 3245, and 3280, local oscillator circuit 3235, and mixer 3230. The single down conversion circuit processes the RF television signal to convert the signal to an intermediate frequency of 20 MHz (i.e., down converts from a range of input frequencies, 55 MHz to 880 MHz, to the IF frequency of 20 MHz). For example, if the input RF television signal comprises a fundamental frequency of 880 MHz, the first down conversion circuit down converts an 880 MHz RF signal to an intermediate frequency signal of 20 MHz.

A band of RF frequencies is converted to the IF frequency. In order to convert the range of frequencies, the local oscillator 3235 (FIG. 32) generates a variable local oscillator signal. The local oscillator signal has a range of frequencies between 860 MHz and 35 MHz. For example, if the input RF signal has a fundamental frequency of 880 MHz, then the local oscillator 3235 is tuned to generate a signal at 860 MHz to produce the intermediate frequency at the output of mixer 3230 of 20 MHz (i.e., 880 MHz–860 MHz).

The IF1 bandpass filter 3240 filters the filter the IF television signal for the IF frequency of 20 MHz. The AGC 3245 circuit provides gain for the IF television signal, and the IF1 composite filter 3250 processes the IF1 television signal for extraction of the tuned channel sound carrier ($F_s$) and the tuned channel picture carrier ($F_P$). An AGC circuit 3260 provides additional gain for the color carrier frequency.

Figure 33:
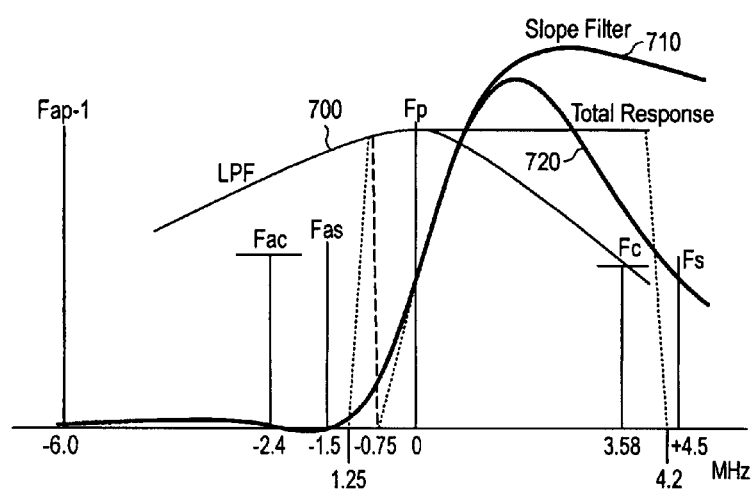
FIG. 33 illustrates a frequency response realized by one embodiment of the Nyquist slope filter.

FIG. 33 illustrates a frequency response realized by one embodiment of the Nyquist slope filter. FIG. 33 shows a waveform of a six (6) MHz channel for tuning by the television receiver. The channel includes a picture component, modulated on a picture carrier frequency ($F_P$), a color component, modulated on a color carrier frequency ($F_c$), and a sound component modulated on a sound carrier frequency ($F_s$). The television channel waveform shown in FIG. 33 is a baseband television signal. Thus, the picture carrier frequency ($F_P$) is at 0 MHz, the color carrier frequency is at 3.58 MHz, and the sound carrier frequency is at 4.5 MHz.

FIG. 33 also shows a channel adjacent to the tuned television channel (e.g., the adjacent channel at a lower frequency). The relative components of the adjacent channel are shown relative to the tuned channel. Specifically, the adjacent sound carrier ($F_{as}$) is shown at 1.5 MHz below the picture carrier of the tuned channel. Also, the adjacent color carrier ($F_{ac}$) and adjacent picture carrier frequency ($F_{ap-1}$) are shown at −2.4 MHz and −6.0 MHz, respectively, below the picture carrier frequency for the tuned channel.

As shown in FIG. 33, the Nyquist slope filter of the present invention realizes close to an ideal Nyquist slope response. The Nyquist slope frequency response is shown as curve 710 in FIG. 33. As shown in FIG. 33, the Nyquist slope frequency response crosses the picture frequency carrier at 0 MHz so as to attenuate approximately half (0.5) of the total energy of the television channel at the picture frequency carrier.

The Nyquist slope filter of the present invention also provides adjacent channel rejection. In one embodiment, the Nyquist slope filter response includes at least two zero crossings. For the embodiment shown in FIG. 33, the Nyquist slope filter response includes three zero crossings. This response provides three notch filters to reject the adjacent television channel. In one embodiment, the Nyquist slope filter includes notch filters to maximize suppression of the adjacent channel at the picture, color carrier, and sound carrier frequency components. Specifically, as shown in FIG. 33, the Nyquist slope filter response includes three zero row crossings: −0.5 MHz (adjacent sound carrier frequency), −2.4 MHz (adjacent color carrier frequency), and −6.0 MHz (adjacent picture carrier frequency).

FIG. 33 also depicts (response curve 700) an example frequency response for the low pass filters (e.g., low pass filters 3040 and 3050, FIG. 30). For this embodiment, the low pass filter response 700 has a center pass frequency centered around the picture carrier frequency (0 Mhz) for the tuned channel. A third response curve, labeled 720 in FIG. 33, represents the total transfer response for the low pass filters and the Nyquist slope filter (i.e., a combination of the response from curves 700 and 710).

Figure 34:
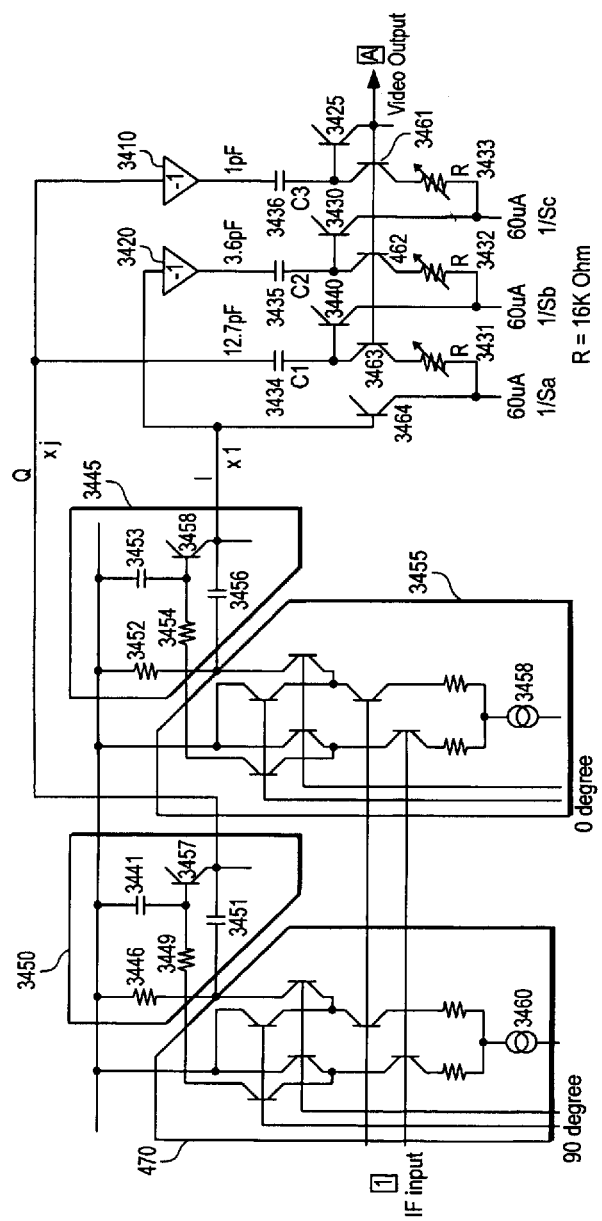
FIG. 34 illustrates one embodiment for the demodulator circuit of the present invention.

FIG. 34 illustrates one embodiment for the demodulator circuit of the present invention. For this embodiment, the mixer 3007 (FIG. 30) is implemented with double balanced mixer 3455, and mixer 3020 (FIG. 30) is implemented with double balanced mixer 3470. As shown in FIG. 34, differential inputs of in-phase local oscillator signal, I signal, are input to double balanced mixer 3455, and differential inputs of quadrature phase local oscillator signal, Q signal, are input to double balanced mixer 3470. Differential IF inputs (e.g., output of tunable bandpass filter 3010) are input to both double balanced mixers 3455 and 3470. Double balanced mixers 3455 and 3470 are biased with current sources 3458 and 3460, respectively.

The differential outputs of double balanced mixer 470 (Q channel) are input to low pass filter 3450. Similarly, the differential outputs of double balanced mixer 3455 (I channel) are input to low pass filter 3445. In one embodiment, the low pass filters (3445 and 3450) are configured as Butterworth lowpass filters. For this embodiment, low pass filter 3450 consists of resistors 3446 and 3449, capacitors 3451 and 3447, and bipolar transistor 3457. Similarly, low pass filter 3445 consists of resistors 3452 and 3454, capacitors 3453 and 3456, and bipolar transistor 3458. As shown in FIG. 34, the output of low pass filter 3450 is a filtered baseband Q signal, and the output of low pass filter 3445 is a filtered baseband I signal.

In one embodiment, the transfer function, expressed in the S domain, of the Butterworth lowpass filter for the I channel follows.

$$I = 1x \frac{1}{1 + 1.4xS + SxS}$$

The transfer function, also expressed in the S domain, of the Butterworth lowpass filter for the Q channel may be expressed as:

$$Q = jx \frac{1}{1 + 1.4xS + SxS}$$

wherein, $S = jx \frac{F}{3 \text{ Mhz}}$.

FIG. 34 also illustrates one embodiment for the quadratic Nyquist slope filter of the present invention. In one embodiment, the Nyquist slope filter comprises a quadratic filter. The Nyquist slope filter provides close to an ideal Nyquist slope through use of quadratic I, Q demodulators. For this embodiment, the quadratic slope filter includes two inverters (3410 and 3420). The invertors invert in-phase (I) and quadrature phase (Q) signals to generate a negative I and Q signals. The negative I and Q signals, along with the positive I and Q signals, constitute the differential I, Q pair. The differential I, Q pair is input to the quadratic Nyquist slope filter. For this embodiment, the Nyquist slope filter is implemented with capacitors 3434, 3435, and 3436 and resistors 3431, 3432, and 3433. A plurality of transistors (3425, 3430, 3440, 3461, 3462, 3463, and 3464) are also used to construct the Nyquist slope filter. In one embodiment, the transistors comprise bipolar transistors. Specifically, the emitter of BJT transistors 3461, 3462, and 3463 are coupled to a constant current source through variable resistors 3433, 3432, and 3431, respectively. In one embodiment, the constant current source generates a current of sixty (60) micro amperes (uA), and the variable resistors are set to a value of 16 kilo ohms. As shown in FIG. 34, capacitor 3434 couples the positive Q input to the base of transistor 3440, capacitor 3435 couples the negative I input to the base of transistor 3440, and capacitor 3436 couples the negative Q input to the base of transistor 3425. In one embodiment, capacitor 3434 has a value of 12.7 pica farads (pF), capacitor 3435 has a value of 3.60 pF, and capacitor 3436 has a value of 1 pF (i.e., C1=12.7 pF, C2=3.6 pF, and C3=1 pF).

In one embodiment, the transfer function for the Nyquist slope filter comprises in all-pass filter. The transfer function is expressed in the S domain. The transfer function is at least a second order function. In one embodiment, the transfer function includes a real number in the numerator and a complex number in the denominator. The Nyquist slope filter comprises inverters so that the transfer function includes only terms in the numerator with the same sign. Specifically, the Nyquist slope filter transfer function may be expressed as:

$$A = \frac{1 + jxS1 - S1xS2 - jxS1xS2xS3}{1 + S1 + S1xS2 + S1xS2xS3}$$

wherein,
$S1 = jwC1R$
$S2 = jwC2R$
$S3 = jwC3R$.

This denominator may be factored as follows.

$$1 + S1 + S1 \times S2 + S1 \times S2 \times S3 = (1 + Sa) \times (1 + Sb) \times (1 + Sc)$$

Thus, the filter transfer function may also be expressed as:

$$A = \frac{(1 + Za)x(1 + Zb)x(1 + Zc)}{(1 + Sa)x(1 + Sb)x(1 + Sc)}$$

wherein, $$Sa = jxZa = jx \frac{F}{1.5 \text{ Mhz}}$$

$$Sb = jxZb = jx \frac{F}{2.4 \text{ Mhz}}$$

$$Sc = jXZc = jx \frac{F}{6 \text{ Mhz}}.$$

Figure 35:
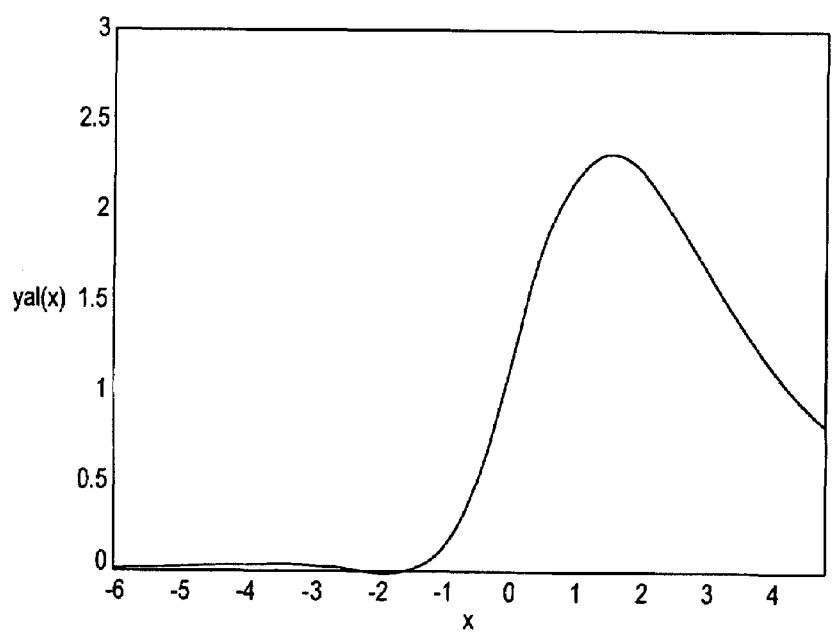
FIG. 35 illustrates one embodiment of a total response curve for the low pass filters and Nyquist slope filter.

FIG. 35 illustrates one embodiment of a total response curve for the low pass filters and Nyquist slope filter. The response curve is applied to filter the television signal at baseband. The frequency response curve of FIG. 35 is normalized to the frequency, x, shown on the x-axis. The attenuation yall(x) is shown as a function of x. For the Butterworth low pass filter embodiment, the transfer function of the low pass filter, realized as a function of X, may be expressed as:

$$LPF = \frac{1}{\sqrt{1 + (X/3)^4}}$$

The Nyquist slope transfer function may be expressed as:

$$NSlope = \frac{\left(1 + \frac{X}{1.5}\right)x\left(1 + \frac{X}{2.4}\right) + \left(1 + \frac{X}{6}\right)}{\sqrt{\left\{1 + \left(\frac{X}{1.5}\right)^2\right\}x\left\{1 + \left(\frac{X}{2.4}\right)^2\right\}x\left\{1 + \left(\frac{X}{6}\right)^2\right\}}}$$

The Nyquist slope filter of the present invention has several advantages over implementing the Nyquist slope in the IF SAW filter. As discussed above in the Background of the Invention section, the SAW filter requires an adjustment in order to track the input frequency with the bandpass characteristics of the SAW filter. In contrast, no tracking or tuning of the Nyquist slope filter is required. In addition, the IF SAW filter implementation introduces group delay in the television signal. No such group delay is introduced through use of the Nyquist slope filter. The SAW filter also generates a large insertion loss for the television signal, between 12–20 dB. Furthermore, the IF SAW filter has a large thermal dependency. The thermal dependency in the SAW filters causes tracking problems for tuning.

Using the Nyquist slope filter of the present invention, no tracking or tuning is required if the I, Q demodulator is phase locked to the input signal. The Nyquist slope filter provides a better Nyquist slope and adjacent channel rejection than the SAW filter implementation. Furthermore, there is no significant signal loss in the Nyquist slope filter. Thus, a 55 dB signal to noise ratio, required to eliminate distortion perceived by a human, is easy to achieve.

LC Filter Banks:

The circuit includes one or more inductive ("L") and capacitive ("C") filter banks applied to realize a non-varactor type television tuner. In one embodiment, the television tuner is integrated into a single integrated circuit chip. The LC banks are used to implement passive filters. The television tuner optimally selects combinations of inductors and capacitors in the LC bank to tune the television receiver.

FIG. 36 is a block diagram illustrating one embodiment for a television tuner that utilizes LC bank filters. The television tuner 3600 receives a radio frequency ("RF") television signal, and generates demodulated baseband television signals (i.e., picture and sound signals). For this embodiment, television tuner 3600 includes inductive banks 3610 and 3624, as well as capacitive banks 3615 and 3626. Inductive bank 3610 and capacitive bank 3615 comprise LC filter bank 3647. Similarly, inductive bank 3624 and capacitive bank 3626 constitute LC filter bank 3625. As described fully below, LC filter banks 3610 and 3615 provide a band pass filter function for television receiver 3600.

The television circuit 3600 also includes inductors 3602 and 3604 to filter the input RF signal. For this embodiment, the inductors 3602 and 3604 values are set to 21.8 nano henries ("nH") and 91.2 nH, respectively. An automatic gain control circuit 3620 amplifies the signal, output from LC filter bank 3647, for input to the second LC filter bank 3625. Inductor 3622, with a value of 91.2 nH, adds a parallel inductance to LC filter bank 3625. As described more fully below, LC filter banks 3647 and 3625 generate a band pass frequency response for conditioning of the input signal.

The television tuner 3600 contains one or more down conversion stages. For this embodiment, television tuner 3600 includes two quadratic downconverters. A first quadratic downconverter is implemented using mixers 3630 and 3632, local oscillator 3640, and notch filter 3650. The first quadratic downconverter converts the frequency of the filtered RF television signal to a first immediate frequency (e.g., 45.75 mega hertz ("MHz")). In general, a quadratic demodulator splits the input signal, and mixes the input signal with an in-phase ("I") local oscillator signal and a quadrature phase ("Q") local oscillator signal. The Q local oscillator signal is phase shifted 90 degrees from the I local oscillator signal.

A second quadratic downconverter circuit, which receives the output signal from the first quadratic downconverter circuit, includes mixers 3660 and 3665, local oscillator 3670, notch filter 3680, and band pass filter 3690. The second quadratic downconverter converts the frequency of the first intermediate television signal to a second immediate frequency (e.g., 10.5 mega hertz ("MHz")). The television receiver also includes IF processing 3695. The IF processing module 3695 generates baseband picture and sound carrier components.

Figure 37:
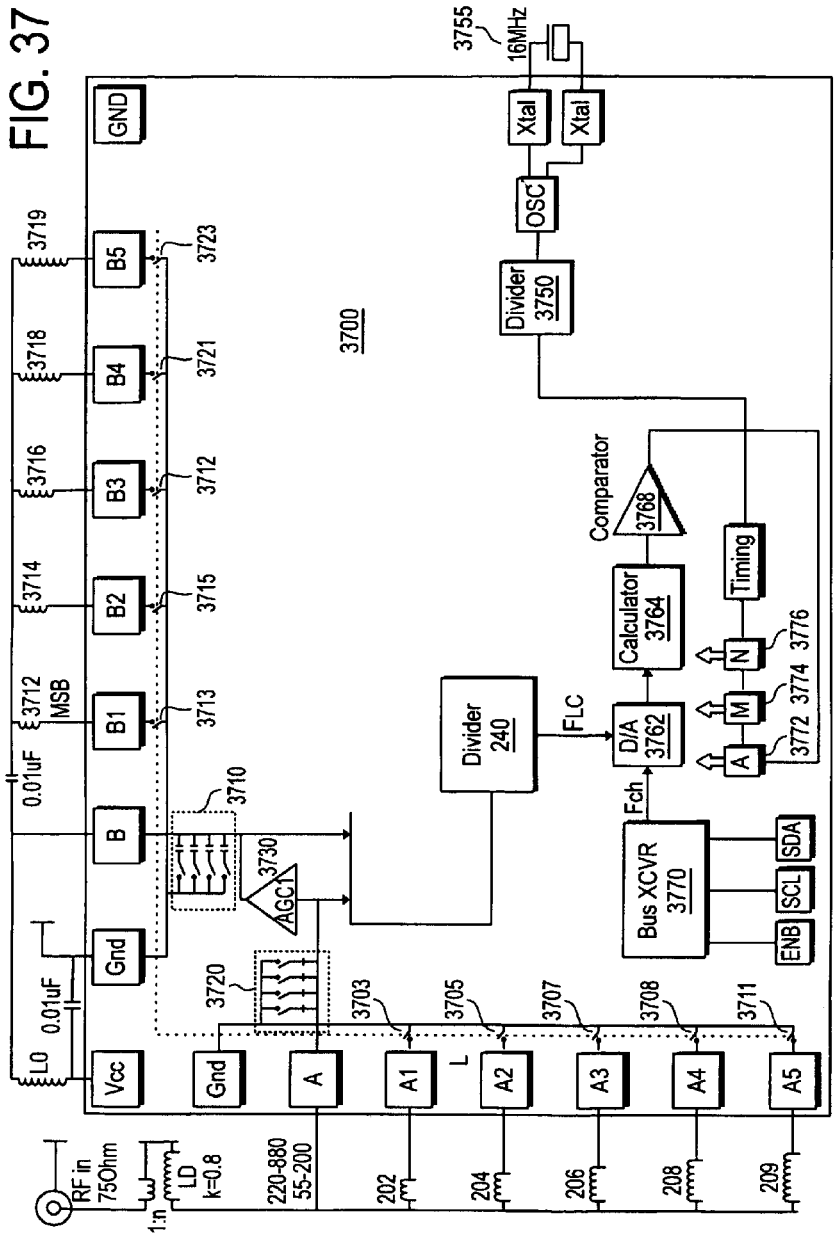
FIG. 37 is a block diagram illustrating one embodiment for implementing the LC bank filters in a television tuner.

FIG. 37 is a block diagram illustrating one embodiment for implementing the LC bank filters in a television tuner. A television receiver 3700 includes inductive "L" banks A and B. For this embodiment, the L banks are implemented external to an integrated circuit 3700. The L bank "A" consists of five inductors (3702, 3704, 3706, 3708, and 3709). Similarly, L bank "B" contains five inductors (3747, 3714, 3716, 3718, and 3719). Each inductor of inductive bank A is electrically coupled to integrated circuit 3700 through an input/output ("I/O") pad (i.e., pad A1 couples conductive 3702, pad A2 couples inductors 3704, pad A3 couples inductive 3706, pad A4 couples inductor 3708, and pad A5 couples inductor 3709). Similarly, an I/O pad is provided for each inductor in L bank B (i.e., pad B1 couples inductor 3747, pad B2 couples inductor 3714, pad B3 couples inductor 3716, pad B4 couples inductor 3718, and pad B5 couples inductor 3719). A switch is provided for each inductor in both L banks A and B (switches 3703, 3705, 3707, 3708 and 3711 for L bank A, and switches 3713, 3715, 3717, 3721 and 3723 for L bank B). A total inductance is generated for each L bank by selectively coupling the external inductors to the television receiver circuit through the switches. Specifically, a digital code (hereafter referred to as the N code) is applied to the switches to select inductors in the L bank. In one embodiment, the switches are implemented using metal oxide semiconductor ("MOS") transistors.

L bank A has a corresponding capacitive ("C") bank A, labeled 3720 in FIG. 37. Similarly, L bank B has a corresponding capacitive bank B, labeled 3710 in FIG. 37. In one embodiment, the C bank contains four capacitors per bank. As shown in FIG. 37, C bank 3720 includes a plurality of capacitors (3725, 3722, 3724, and 3727) coupled to a plurality of switches (3732, 3731, 3729 and 3728). The capacitors are selected using a code (hereafter referred to as an M code), to control the switches that couple the capacitors to the television receiver circuit.

The television receiver circuit 3700 includes circuitry to select or program the LC filter banks. In general, television receiver 3700 generates the M code and N code to selectively program the LC filter banks. By selecting different combinations of inductors (L bank) and capacitors (C bank), different filter characteristics (i.e., frequency responses) are realized. For the embodiment shown in FIG. 37, television receiver 3700 receives information, referred to as a channel code, that specifies the desired television channel. In one embodiment, the channel code is received by bus transceiver 3770, using its external pins (ENB, SCL, and SDA). A programmable divider 3740 is used to digitize at least a portion of the channel code (e.g., 10 bits). The programmable divider 3740 is also used to digitize an LC oscillation frequency. The LC oscillation frequency is the center frequency for a tuned cavity generated by the combination of selected inductors and capacitors from the LC banks. The LC oscillation frequency is generated using amplifier (AGC) 3730. The tuning circuit for television receiver 3700 includes a timing reference, and associated circuitry to generate various timing signals. An oscillator circuit, which uses a 16 MHz crystal (3755), is coupled to a divider 3750 to generate timing signals.

Television receiver 3700 also includes a plurality of digital to analog (D/A) circuits 3762 to convert digital values to analog currents. In one embodiment, the analog currents are used in a calculator 264 and a comparator circuit 268 for tuning of the LC filter banks. Register 3772 stores a digital value, A. The digital values for M code and N code are stored in registers 3774 and 3776, respectively. As shown in FIG. 37, digital values (A, M, N and FLC, and frequency of the channel code "$F_{ch}$") are input to D/A circuits 3762. As shown in FIG. 37, the calculator 3764 and comparator circuit 3768 generates a value for A, the M code and the N code using the timing from timing circuit 3760.

FIG. 38a illustrates one embodiment for an inductive (L) bank for use in the LC filter bank. For this embodiment, the inductive bank includes five inductors (3815, 3820, 3825, 3830 and 3840). Although the inductive bank 3800 includes five inductors, any number of inductors may be used without deviating from the spirit or scope of the invention. In one embodiment, the number and values for the inductors is a function of the desired frequency response characteristics of the LC filter bank. The inductors, which form inductive bank 3800, are configured in parallel. For the embodiment of FIG. 38a, the inductor values are 5.7, 11.4, 22.8, 45.6, and 91.2 nH. Each inductor is added to the L bank through a corresponding switch (switches 3810, 3808, 3806, 3804 and 3802). In one embodiment, the switches are implemented using metal oxide semiconductor ("MOS") transistors.

FIG. 38b illustrates one embodiment for a capacitive bank for use in the LC filter bank of the present invention. For this embodiment, capacitive bank 3850 contains five capacitors (3860, 3862, 3864, 3866 and 3868). For this embodiment, the capacitor values are 3.7, 9.4, 17, 32.8 and 64.6 pF. A different number of capacitors and different capacitive values may be selected to implement filters for the LC filter bank with different frequency responses. Also, as shown in FIG. 38b, capacitors 3860, 3862, 3864 and 3866 are selected for the C bank through switches 3858, 3856, 3854 and 3852, respectively. In one embodiment, the switches are implemented with MOS transistors.

Figure 39A:
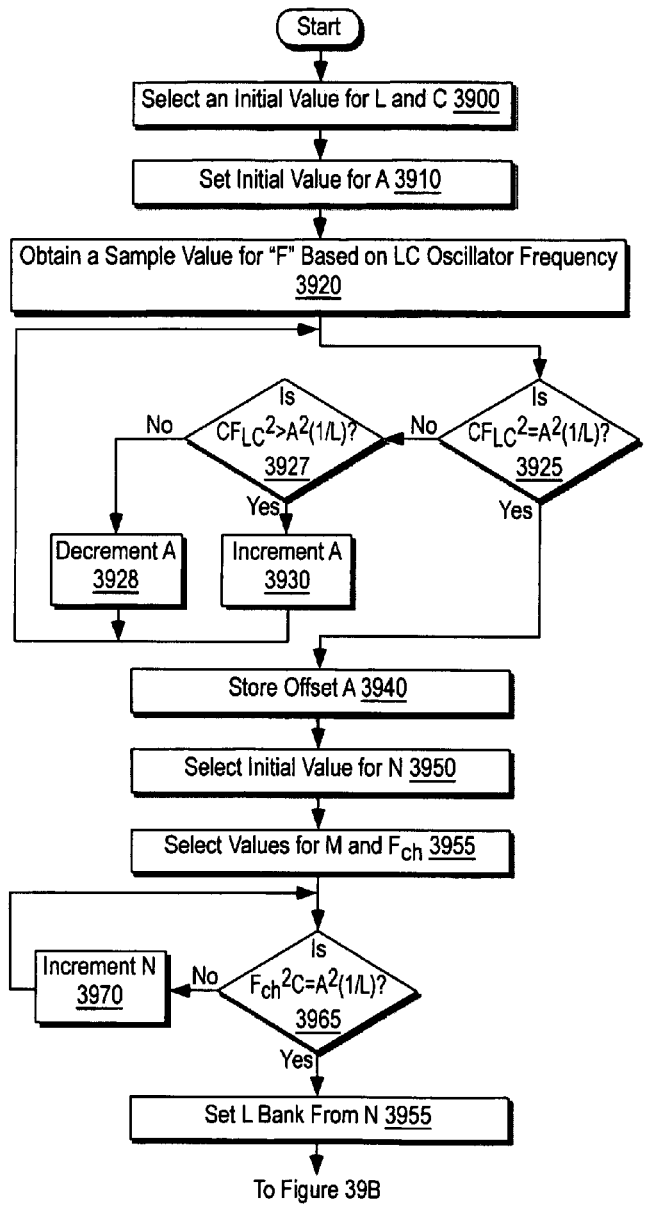
FIGS. 39a and 39b are flow diagrams illustrating one embodiment for tuning the LC filter bank for a channel in the VHF spectrum.
Figure 39B:
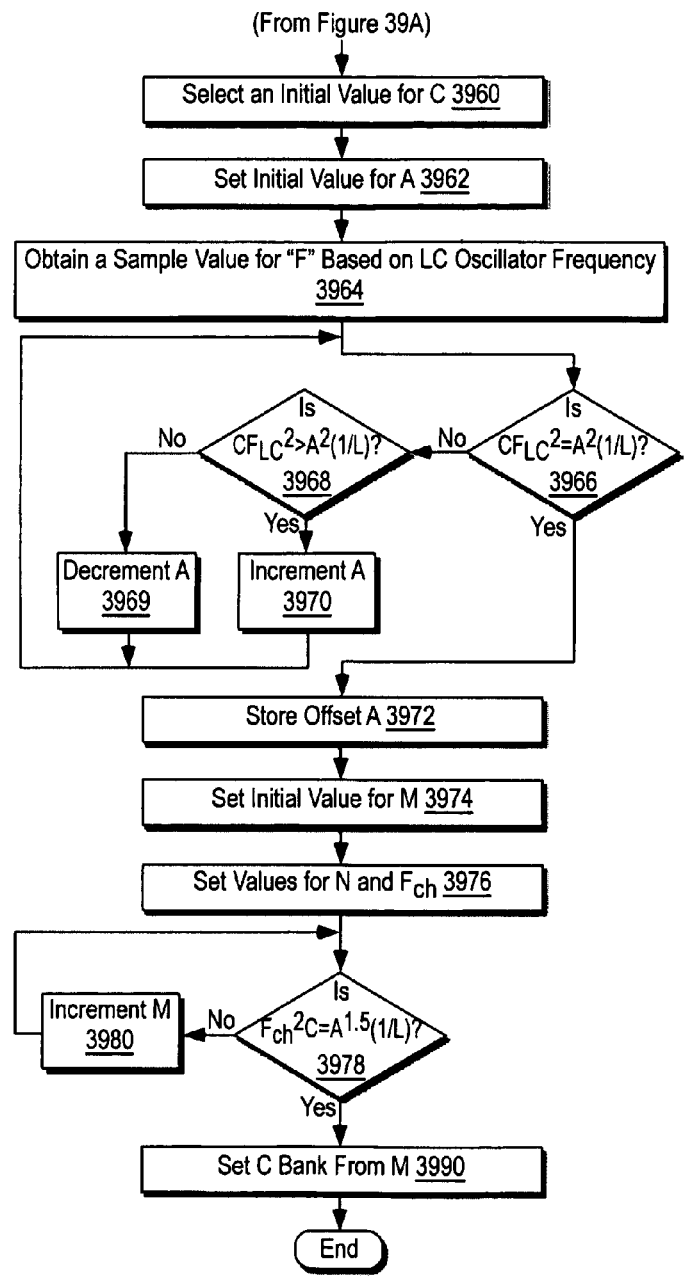

FIGS. 39a and 39b are flow diagrams illustrating one embodiment for tuning the LC filter bank for a channel in the VHF spectrum. The process is initiated by selecting an initial value for the inductance, L, (i.e., N code) and capacitance, C (i.e., M code) (block 3900, FIG. 39a). In one embodiment, M is set to a value of binary 0100, and N is set to a value of binary 0001. A variable, A, is used to determine an offset between the currently tuned LC oscillator frequency, $F_{LC}$, and the desired tuned channel frequency, $F_{ch}$. In one embodiment, A comprises a five bit digital value. The variable, A, is set to an initial condition (block 3910, FIG. 39a). In one embodiment, the initial condition is equal to "10000."

The circuit obtains a sample value for the LC oscillator frequency ("$F_{LC}$") (block 3920, FIG. 39a). The LC oscillator frequency is converted from an analog signal to a digital value using a high-speed divider. The comparator circuit (3785, FIG. 37) is used to evaluate the expression:

$$CF_{LC}^2 = A^2(1/L)$$

Figure 54:
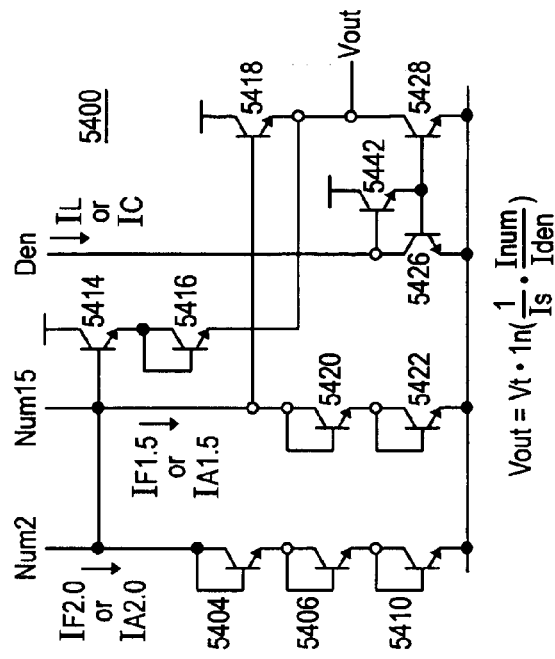
FIG. 54 illustrates one embodiment for a calculator used in the functional comparator circuit of FIG. 53.
Figure 53:
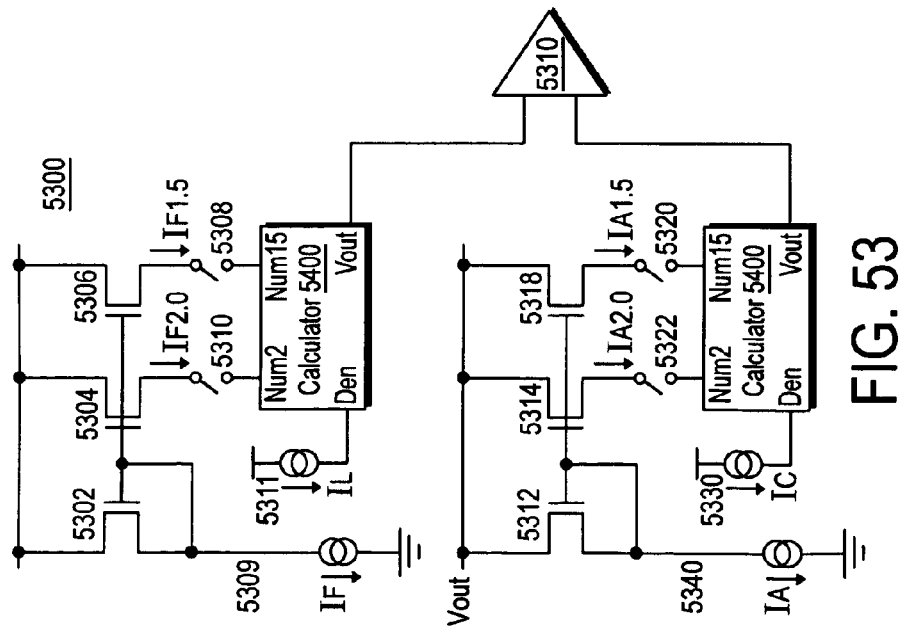
FIG. 53 illustrates one embodiment for a functional comparator circuit used in one embodiment for tuning the LC filter bank.

In one embodiment, digital values for C (i.e., M code), FLC, A, and L (i.e., N code) are converted to analog currents using a digital to analog converter, and the analog currents are input to a calculator, to generate both numeric sides of the expression, and a comparator to evaluate the expression (See FIGS. 53 & 54). If the expression is not true (i.e., $CF_{LC}^2$ does not equal $A^2(1/L)$), and $CF_{LC}^2$ is greater than $A^2(1/L)$, then the digital value for A is incremented (blocks 3925, 3927 and 3930, FIG. 39a). For example, after the first evaluation, if $CF_{LC}^2$ is greater than $A^2(1/L)$, then the initial value of A, 10000, is incremented to the value of 10001. If the expression is not true (i.e., $CF_{LC}^2$ does not equal $A^2(1/L)$), and $CF_{LC}^2$ is less than $A^2(1/L)$, then the digital value for A is decremented (blocks 3925, 3927 and 3928, FIG. 39a). For example, after the first evaluation, if $CF_{LC}^2$ is less than $A^2(1/L)$, then the initial value of A, 10000, is decremented to the value of 01111. This process repeats until the expression evaluates to true. When the expression evaluates to true, the offset, A, has been calculated. The offset is stored in a register for subsequent use (block 3940, FIG. 39a).

To tune the input VHF channel, a value for the N code is first determined. The selection of N (inductive selection) results in coarse tuning a channel in the VHF spectrum. The circuit sets an initial value for the N code (block 3950, FIG. 39a). In one embodiment, N is set to a value of 00001. Also, values are selected for M and $F_{ch}$ (block 3955, FIG. 39a). In one embodiment, the M code is set to a value of 0100, and $F_{ch}$ is set to the value of the channel code (i.e., the desired tuned frequency).

A circuit evaluates the expression:

$$CF_{ch}^2 = A^2(1/L).$$

In one embodiment, digital values for C (i.e., M code), $F_{ch}$, A, and L (i.e., N code) are converted for evaluation of the expression. If the expression is not true (i.e., $CF_{ch}^2$ does not equal $A^2(1/L)$), then the digital value for N is incremented (blocks 3965 and 3970, FIG. 39a). For example, after the first evaluation, if $CF_{LC}^2$ is not equal to $A^2(1/L)$, then the initial value of N, 00001, is incremented to the value of 00010. This process repeats until the expression evaluates to true. When the expression evaluates to true, the N code has been determined, and the L bank is set based on the N code (block 3955, FIG. 39a).

The process re-calculates the offset, A, after the course tuning procedure. The variable, A, is set to an initial condition (e.g., 10000) (block 3962, FIG. 39b). The circuit obtains a new sample value for the LC oscillator frequency, $F_{LC}$, after the course tuning (block 3964, FIG. 39b). The frequency, $F_{LC}$, is converted from an analog signal to a digital value using a high-speed divider. The following expression is evaluated:

$$CF_{LC}^2 = A^2(1/L)$$

If the expression is not true (i.e., $CF_{LC}^2$ does not equal $A^2(1/L)$), and $CF_{LC}^2$ is greater than $A^2(1/L)$, then the digital value for A is incremented (blocks 3966, 3968 and 3970, FIG. 39b). If the expression is not true (i.e., $CF_{LC}^3$ does not equal $A^2(1/L)$), and $CF_{LC}^2$ is less than $A^2(1/L)$, then the digital value for A is decremented (blocks 3966, 3968 and 3969, FIG. 39b). This process repeats until the expression evaluates to true. When the expression evaluates to true, the new offset, A, has been calculated. The offset is stored in a register for subsequent use (block 3972, FIG. 39b).

Next, a value for the M code, and consequently C, is determined. The selection of M results in fine tuning a channel in the VHF spectrum. First, an initial value is set for M (block 3974, FIG. 39b). In one embodiment, M is initially set to a value of 0000. Also, the values for $F_{ch}$ and N code are selected. $F_{ch}$ represents the frequency of the channel code. The N code was set from the coarse tuning stage. The expression, $F_{ch}^{1.5}C = A^{1.5}(1/L)$, is evaluated to determine if it is true (block 3978, FIG. 39b). In one embodiment, these digital values are converted to analog current values using digital to analog converters. The analog current values are then weighted in accordance with the expression (e.g., $A^{1.5}$, $F_{ch}^{1.5}$, etc.) using a calculator, and then compared using a comparator (See FIGS. 53 and 54). If the expression does not evaluate to true, the M code is incremented (block 3980, FIG. 39b), and the expression is again evaluated with the new M code. This process is repeated until the expression evaluates to true. With the expression evaluates to true, the capacitive bank is set based on the M code (block 3990, FIG. 39*b*).

FIG. 40 shows one embodiment for selecting inductors in an inductor bank from the N code. The first column of FIG. 40 shows inductor values for the corresponding inductors in the inductor bank shown in column 2. For example, inductor L5 has a value of 5.7 nH, while inductor L1 has a value of 91.2 nH. Note that inductor L0 is always selected. A binary N code for selecting inductors in the inductor bank is shown. For example, column 3 shows selection of inductor L0 for the N code of 00000. The last column of FIG. 40 shows selection of inductors from the inductor bank for the N code of 00111. Specifically, the "00111" N code specifies selection of inductors L0, L1, L2 and L3 from the inductor bank. The last row of FIG. 40 shows the total inductance for the corresponding N code. For example, for the "00000" N code, the total inductance of the inductance bank is equal to 91.2 nH. The total inductance for the "00111" N code is equal to 11.4 nH.

The inductors and capacitors are selected from the C and L banks, respectively, the use of switches (e.g., MOS transistors). A resistance is introduced into the LC bank filter response by each transistor. Thus, each capacitor selected in the C bank increases the series resistance. The increase in series resistance, or decrease in parallel resistance, decreases the Q factor, which, in turn, degrades performance of the LC bank filter.

In general, a Q factor is measured based on the expression:

$$Q = 2\pi fRC$$

In one embodiment, the receiver selects a combination of inductors and capacitors to configure an LC filter bank so as to maximize the Q factor. As shown by the above expression, the larger the parallel resistance and capacitance, the greater the Q factor. It is an objective to maximize the Q factor through proper selection of inductance and capacitance combinations from the LC banks.

FIG. 41 illustrates various resistances for selected inductances of the L bank. Specifically, column two lists a resistance, $r_s$, from the corresponding inductor. For example, L5 has a resistance of 0.7 ohms. The third column lists the resistance, $R_{MOS}$, from the MOS transistor for the corresponding inductor. For example, L4 has a $R_{MOS}$ resistance of 1.6 ohms. The fourth column lists the total series resistance, $r_s$, from selecting the corresponding inductor. For example, L3 has a total series resistance, $r_s$, of 2.8 ohms. The last row of FIG. 41 lists the total series resistance for the corresponding N code. For example, an N code of 00010 has a total series resistance of 2.4 ohms. The circuit selects combinations of the inductors from an L bank to reduce the total series resistance and thus maximize the Q factor.

Figure 42:
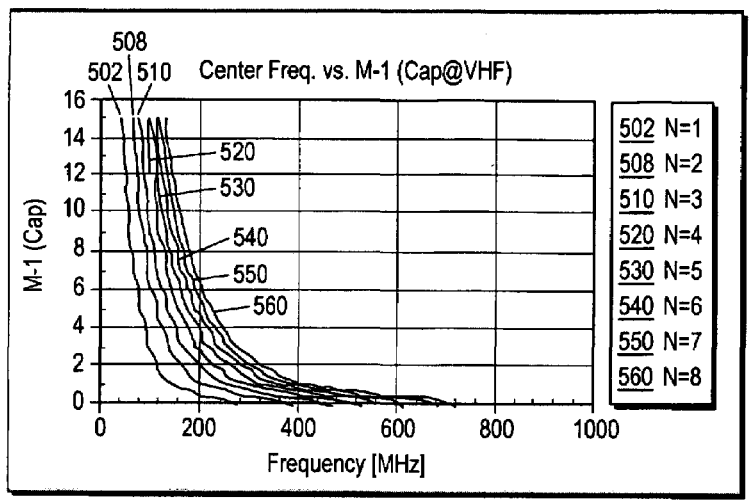
FIG. 42 is a graph that depicts the relationship between the center frequency of an LC bank filter and the total capacitance as a function of the M code.

FIG. 42 is a graph that depicts the relationship between the center frequency of an LC bank filter and the total capacitance as a function of the M code. As shown in FIG. 42, for center frequencies in the VHF spectrum, a higher M code (i.e., overall capacitance) yields a higher frequency. FIG. 42 also depicts the relationship between the M code and center frequency of the LC bank filter (and the desired channel) for each value of the N code.

Figure 43:
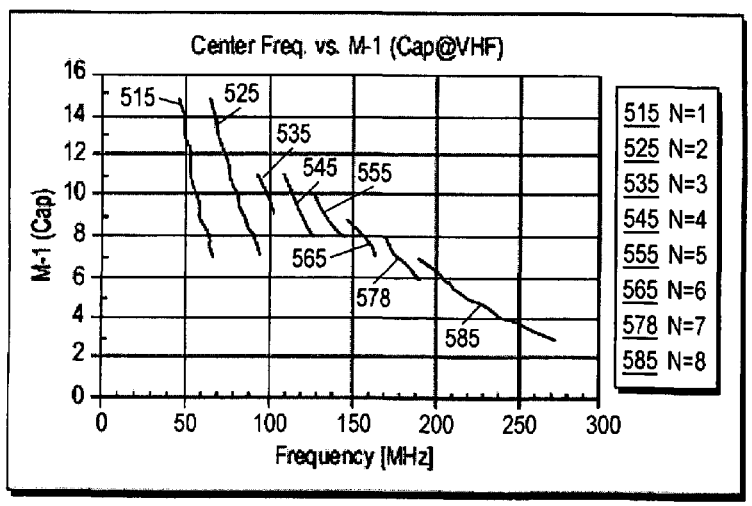
FIG. 43 depicts relationships between the selected M code and center frequency for various combinations of the N code.

In order to maximize the Q factor, only certain combinations of the N code and M code are used. FIG. 43 depicts relationships between the selected M code and center frequency for various combinations of the N code. Note that the relationship between the center LC bank filter frequency and the M code is now confined to the center of a graph. This relationship minimizes the Q factor, and optimizes the response of the LC filter bank.

As discussed above, the tuning circuit of the present invention only selects certain combinations of N and M codes to configure the LC bank filter. FIG. 44 shows the information for capacitance and M code for selecting capacitors in a C Bank during VHF tuning. The first column of FIG. 44 lists the total capacitance, which ranges from 3.7 pF to 477.7 pF, for the C bank. The second column identifies an M code to obtain the corresponding capacitance value in column one. For example, a decimal M code of 47 yields a total capacitance of 101.3 pF. Column 3 of FIG. 44 shows valid selections for the M code based on the frequency and the value of the N code. For example, in column 3, a list of frequencies is shown for valid selections of the M code when the N code is equal to 1. Specifically, column 3 shows that for these frequencies and N code, the M code has a valid range between 8 and 16 (decimal).

FIG. 45 shows various resistances for selected capacitances of the C bank. Column two lists a resistance, $R_{MOS}$, for a corresponding capacitor. For example, M code 10 (decimal) has a resistance of 1.8 ohms. The circuit selects combinations of the capacitors from a C bank to reduce the total series resistance and thus maximize the Q factor.

Figure 46A:
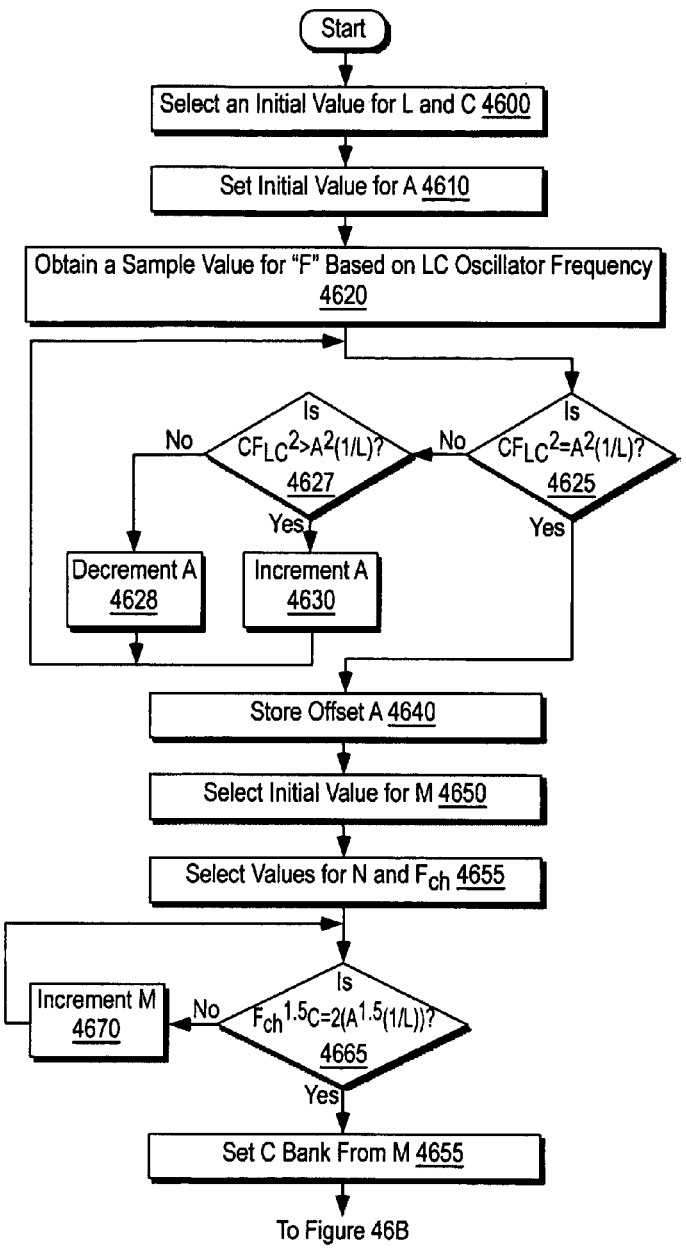
FIGS. 46a and 46b are flow diagrams illustrating one embodiment for tuning the LC filter bank for a channel in the UHF spectrum.
Figure 46B:
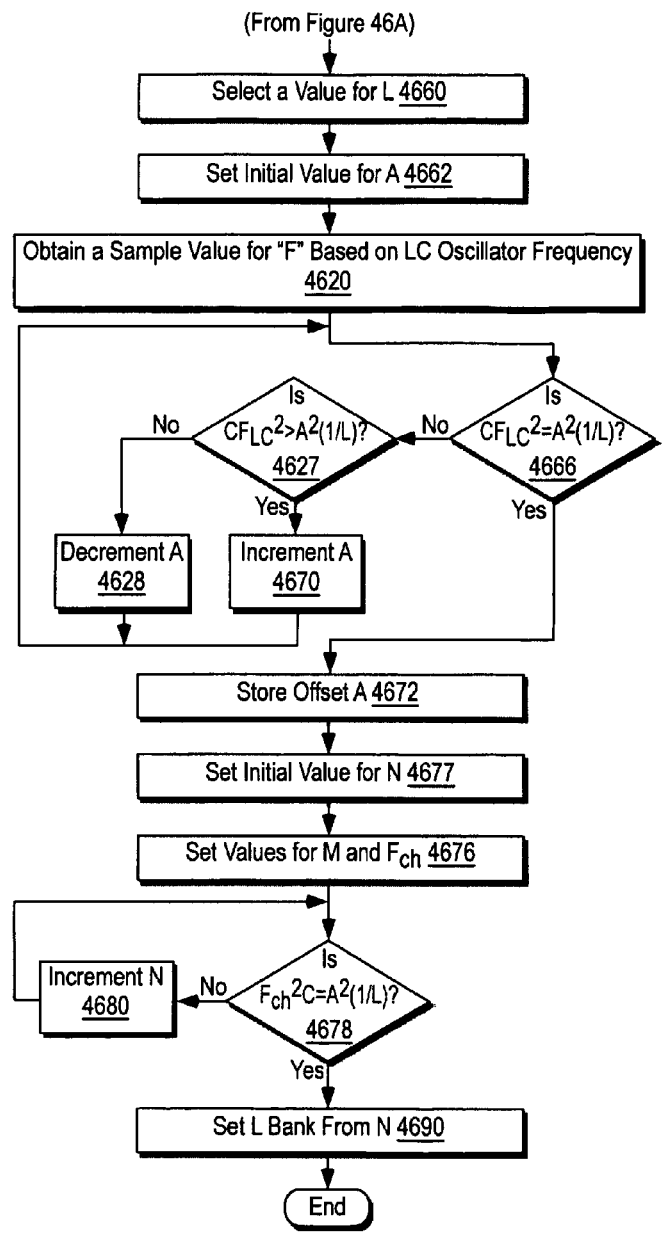

FIGS. 46*a* and 46*b* are flow diagrams illustrating one embodiment for tuning the LC filter bank for a channel in the UHF spectrum. The process is initiated by selecting an initial value for the inductance, L, (i.e., N code) and capacitance, C (i.e., M code) (block 4600, FIG. 46*a*). In one embodiment, M is set to a value of binary 0001, and N is set to a value of binary 10000. The variable, A, is set to an initial condition (block 4610, FIG. 46*a*). In one embodiment, the initial condition is equal to "10000."

The circuit obtains a sample value for the LC oscillator frequency ("$F_{LC}$") (block 4620, FIG. 46*a*). The LC oscillator frequency is converted from an analog signal to a digital value using a high-speed divider. The following expression is evaluated:

$$CF_{LC}^2 = A^2(1/L).$$

If the expression is not true (i.e., $CF_{LC}^2$ does not equal $A^2(1/L)$), and $CF_{LC}^2$ is greater than $A^2(1/L)$, then the digital value for A is incremented (blocks 4625, 4627 and 4630, FIG. 46*a*). For example, after the first evaluation, if $CF_{LC}^2$ is greater than $A^2(1/L)$, then the initial value of A, 10000, is incremented to the value of 10001. If the expression is not true (i.e., $CF_{LC}^2$ does not equal $A^2(1/L)$), and $CF_{LC}^2$ is less than $A^2(1/L)$, then the digital value for A is decremented (blocks 4625, 4627 and 4628, FIG. 46*a*). For example, after the first evaluation, if $CF_{LC}^2$ is less than $A^2(1/L)$, then the initial value of A, 10000, is decremented to the value of 01111. This process repeats until the expression evaluates to true. When the expression evaluates to true, the offset, A, has been calculated. The offset is stored in a register for subsequent use (block 4640, FIG. 46*a*).

To tune the input UHF channel, a value for the M code is first determined. The selection of M (capacitive selection) results in coarse tuning a channel in the UHF spectrum. The circuit sets an initial value for the M code (block 4650, FIG. 46*a*). In one embodiment, M is set to a value of 00001. Also, values are selected for N and $F_{ch}$ (block 4655, FIG. 46*a*). The N code is set to a value of 10000, and $F_{ch}$ is set to the value of the channel code (i.e., the desired tuned frequency).

A circuit evaluates the expression:

$$CF_{ch}^{1.5} = 2(A^{1.5}(1/L)).$$

If the expression is not true (i.e., $CF_{ch}^{1.5}$ does not equal $2(A^{1.5}(1/L))$), then the digital value for M is incremented (blocks 4665 and 4670, FIG. 46*a*). For example, after the first evaluation, if $CF_{ch}^{1.5}$ is not equal to $2(A^{1.5}(1/L))$ then the initial value of M, 00001, is incremented to the value of 00010. This process repeats until the expression evaluates to true. When the expression evaluates to true, the M code has been determined, and the C bank is set based on the M code (block 4655, FIG. 46*a*).

The process re-calculates the offset, A, after the course tuning procedure. The variable, A, is set to an initial condition (e.g., 10000) (block 4662, FIG. 46*b*). The circuit obtains a new sample value for the LC oscillator frequency, FLC, after the course tuning (block 4664, FIG. 46*b*). The frequency, FLC, is converted from an analog signal to a digital value using a high-speed divider. The following expression is evaluated:

$$CF_{LC}^2 = A^2(1/L)$$

If the expression is not true (i.e., $CF_{LC}^2$ does not equal $A^2(1/L)$), and $CF_{LC}^2$ is greater than $A^2(1/L)$, then the digital value for A is incremented (blocks 4666, 4668 and 4670, FIG. 46*b*). If the expression is not true (i.e., $CF_{LC}^2$ does not equal $A^2(1/L)$), and $CF_{LC}^2$ is less than $A^2(1/L)$, then the digital value for A is decremented (blocks 4666, 4668 and 4669, FIG. 46*b*). This process repeats until the expression evaluates to true. When the expression evaluates to true, the new offset, A, has been calculated. The offset is stored in a register for subsequent use (block 4672, FIG. 46*b*).

Next, a value for the N code, and consequently L, is determined. The selection of the N code results in fine tuning a channel in the UHF spectrum. First, an initial value is set for N (block 4674, FIG. 46*b*). In one embodiment, N is initially set to a value of 0000. Also, the values for $F_{ch}$ and M code are selected. $F_{ch}$ represents the frequency of the channel code. The M code was set from the coarse tuning stage. The expression, $F_{ch}^{2.0} C = A^{2.0}(1/L)$, is evaluated to determine if it is true (block 4678, FIG. 46*b*). In one embodiment, these digital values are converted to analog current values using digital to analog converters. The analog current values are then weighted in accordance with the expression (e.g., $A^{2.0}$, $F_{ch}^{2.0}$, etc.) using a calculator, and then compared using a comparator (See FIGS. 53 and 54). If the expression does not evaluate to true, the N code is incremented (block 4680, FIG. 46*b*), and the expression is again evaluated with the new N code. This process is repeated until the expression evaluates to true. With the expression evaluates to true, the inductive bank is set based on the N code (block 4690, FIG. 46*b*).

FIG. 47 shows one embodiment for selecting capacitors in a capacitor bank for UHF tuning. The first column of FIG. 47 shows capacitor values for the corresponding capacitors listed in column 2. For example, capacitor C3 has a value of 32.8 pF, while capacitor C1 has a value of 9.4 pF. Note that capacitor C0 is always selected. A binary M−1 code for selecting capacitors in a capacitor bank is shown. For example, column 3 shows selection of capacitor C0 for the M−1 code of 00001. The last column of FIG. 47 shows selection of capacitors from the capacitor bank for the M−1 code of 01111. Specifically, the "01111" M−1 code specifies selection of capacitors C0, C1, C2 and C3 from the capacitor bank. The last row of FIG. 47 shows the total capacitance for the various M−1 codes. For example, for the "00001" M−1 code, the total capacitance of the capacitor bank is equal to 3.7 pF. The total capacitance for the "01111" M−1 code is equal to 62.9 pF.

Figure 48:
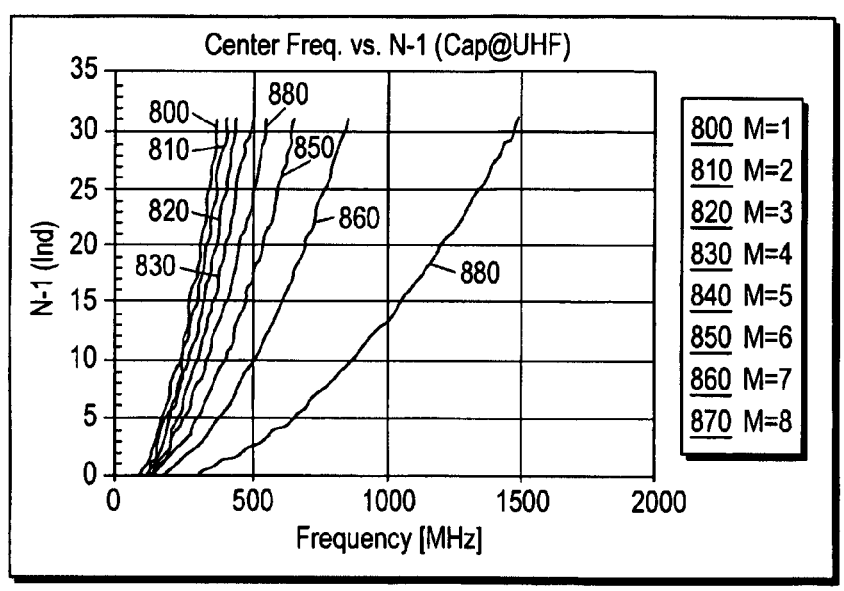
FIG. 48 is a graph that depicts the relationship between the center frequency of an LC bank filter and the total inductance as a function of the N−1 code.

FIG. 48 is a graph that depicts the relationship between the center frequency of an LC bank filter and the total inductance as a function of the N−1 code. As shown in FIG. 48, for center frequencies in the UHF spectrum, a lower N−1 code (i.e., overall inductance) yields a higher center frequency. FIG. 48 also depicts the relationship between the N−1 code and center frequency of the LC bank filter (and the desired channel) for each value of the M code. For example, curve 870 shows the relationship between the center frequency of an LC bank filter and the total inductance as a function of the N−1 code when M is equal to 7.

Figure 49:
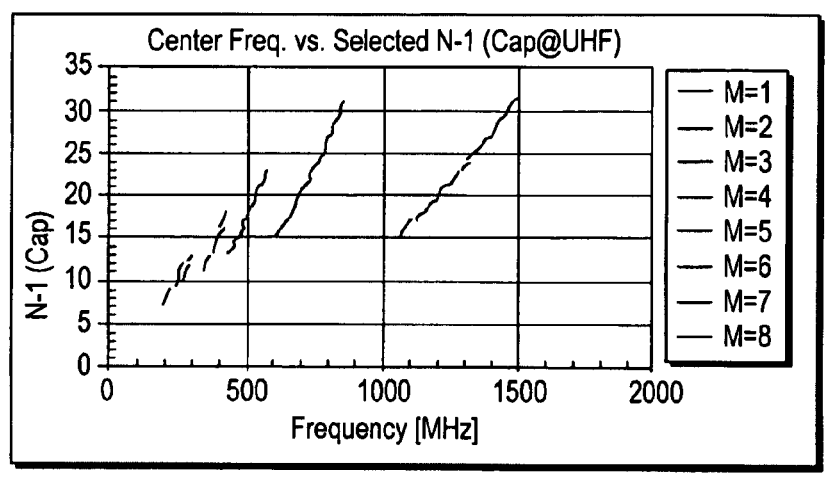
FIG. 49 depicts relationships between the selected N−1 code and center frequency for various combinations of the M code.

As discussed above, in order to maximize the Q factor, only certain combinations of the N code and M code are used. FIG. 49 depicts relationships between the selected N−1 code and center frequency for various combinations of the M code. Note that the relationship between the center LC bank filter frequency and the N−1 code is now confined to the center of a graph. This relationship minimizes the Q factor, and optimizes the response of the LC filter bank.

FIGS. 50*a* and *b* show the information for selecting inductors in an L Bank during UHF tuning. The first column of FIGS. 50*a* and *b* lists the total inductance, which ranges from 2.85 nH to 91.2 nH, for the L bank. The second column identifies an N−1 code to obtain the corresponding inductance values of column one. For example, a decimal N−1 code of 27 yields a total inductance of 3.3 nH. Column 3 of FIGS. 50*a* and *b* shows valid selections for the N−1 code based on the frequency and the value of the M code. For example, in column 3, a list of frequencies is shown for valid selections of the N−1 code when the M code is equal to 1. Specifically, column 3 shows that for these frequencies and N−1 code, the M code has a valid range between 11 and 32 (decimal).

FIG. 51 illustrates various resistances for selected capacitances of the C bank. The third column of FIG. 51 lists the resistance, $R_{MOS}$, from the MOS transistor for the corresponding capacitor. For example, C2 has a $R_{MOS}$ resistance of 0.66 ohms. The fourth column lists the total series resistance, $r_s$, from selecting the corresponding capacitor. For example, C4 has a total series resistance, $r_s$, of 1.8 ohms. The circuit selects combinations of capacitors from a C bank to reduce the total series resistance and thus maximize the Q factor.

Figure 52:
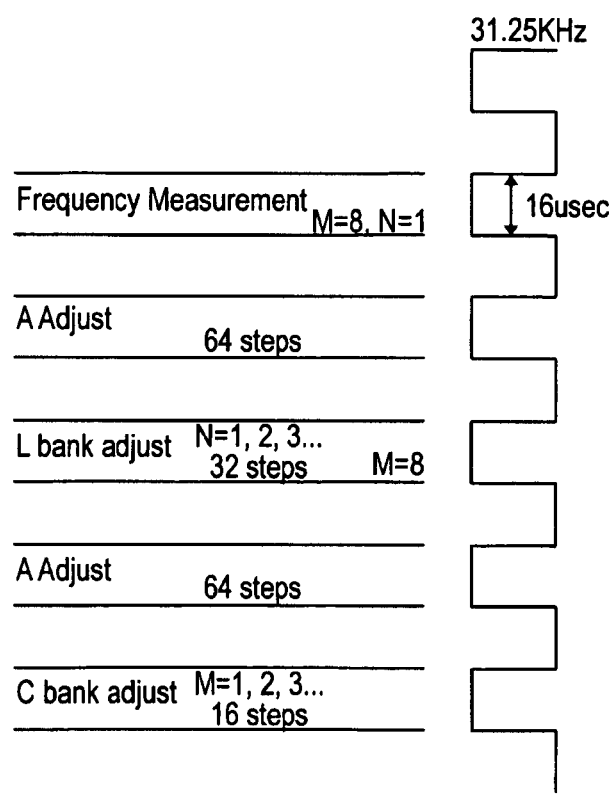
FIG. 52 is a timing diagram that shows timing for tuning the LC filter bank in accordance with one embodiment.

FIG. 52 is a timing diagram that shows timing for tuning the LC filter bank in accordance with one embodiment. As shown in FIG. 52, there are five operations to tune the LC filter bank for a channel in the VHF spectrum. For this embodiment, a timing signal has a frequency of 31.25 kHz. First, a frequency measurement of the LC oscillator frequency is made. As shown in FIG. 52, the LC oscillator frequency measurement occurs in a single 16 micro second cycle. As described in FIG. 39*a*, an offset, A, which indicates the difference between the LC oscillator frequency and the desired frequency, is calculated. The process to calculate the offset, an iterative process, occurs over sixty-four (64) steps (i.e., the value for A is determined in a loop that consists of no more than 64 iterations). As shown in FIG. 52, each step occurs within 16 microseconds.

When tuning the circuit for a desired channel in the VHF spectrum, inductors for the inductor bank are selected first. In one embodiment, the process to select the N code occurs in no more than 32 steps. Again, each step occurs within a 16 micro second cycle.

After inductors for the L bank are selected, a new offset, A, based on the selected inductor bank, is calculated (see FIG. 39*b*). As shown in FIG. 52, calculation of the new offset, A, occurs within no more than 64 steps.

The fifth operation shown in FIG. 52 selects capacitors from the C. bank. As shown in FIG. 52, the process to select the M code occurs in no more than 16 steps, with each step having a period of 16 micro seconds. As discussed above in conjunction with FIGS. 46a and 46b, tuning for channels in the UHF spectrum involves selecting the M code (tuning the capacitor bank) and then selecting the N code (tuning the inductor bank).

FIG. 53 illustrates one embodiment for a functional comparator circuit used in one embodiment for tuning the LC filter bank. A comparator circuit 5300 is used to evaluate expressions. In general, functional comparator circuit 5300 calculates expressions using analog currents. Specifically, for this embodiment, functional comparator circuit 5300 evaluates the expressions:

$$CF_{LC}^2 = A^2(1/L) \quad (1)$$

$$CF_{ch}^2 = A^2(1/L) \quad (2)$$

$$CF_{ch}^{1.5} = 2(A^{1.5}(1/L)) \quad (3)$$

$$F_{ch}^{1.5}C = A^{1.5}(1/L) \quad (4)$$

The above expressions may also be written as:

$$C/A^2 = (1/L)/F_{LC}^2 \quad (1)$$

$$C/A^2 = (1/L)/F_{ch}^2 \quad (2)$$

$$C/2A^{1.5} = (1/L)/F_{ch}^{1.5} \quad (3)$$

$$C/A^{1.5} = (1/L)/F_{ch}^{1.5} \quad (4)$$

The left-hand side of the above expressions (i.e., $C/A^2$, $C/2A^{1.5}$, and $C/A^{1.5}$) are generated using transistors 5347, 5314, and 5318, switches 5320 and 5322, current sources 5330 and 5340 and calculator 4700. Switches 5320 and 5322 are set to select either the 1.5 or 2.0 exponent for the offset variable, A. For example, to evaluate the expression $C/A^{1.5}$, switch 5320 is set to couple the current, $I_{1.5}$, for input to calculator 4700.

In one embodiment, current source 5330 is coupled to a digital to analog converter to convert the digital M code value to an analog current, $I_c$. The analog current, $I_c$, represent the capacitance and the C bank. The current sources 5340, also coupled to a digital to analog converter, converts the digital offset value, A, to an analog current, $I_A$. The output of calculator 4700, $V_{out}$, is input to comparator 5310. The $V_{out}$ voltage represents a value for the left-hand expression.

The right hand side of the above expressions (i.e., $(1/L)/F_{ch}^{1.5}$, $(1/L)/F_{LC}^2$, and $(1/L)/F_{ch}^{1.5}$) are generated using transistors 5302, 5304, and 5306, switches 5308 and 5310, and current sources 5309 and 5311. Switches 5308 and 5310 are used to select the appropriate exponent for the frequency. For example, if the current expression for evaluation is $(1/L)/F_{LC}^2$, then switch 5310 is set. The current source 5311 generates an analog current proportional to the inductor value for the L bank. In one embodiment, the current source 5311 is coupled to an output from a digital to analog converter that converts the digital value of the N code to an analog current. The current source 5309, also coupled to a digital to analog converter, converts the frequency (LC oscillator frequency or channel code frequency) to an analog current. The output of calculator 4700 generates a voltage, $V_{out}$, for the right hand expression.

The left-hand expression and right hand expression are input to comparator 5310. The comparator 5310 compares the $V_{out}$ generated by the left-hand side of the expression, with the $V_{out}$ generated by the right hand side of the expression.

FIG. 54 illustrates one embodiment for a calculator used in the functional comparator circuit of FIG. 53. The calculator circuit receives, as inputs, the weighted currents for frequency or offset, as well as the analog currents for inductance or capacitance. As shown in FIG. 54, the weighted currents for frequency or offset, A, with an exponent of two is input to transistors 5404, 5406, and 5410. The weighted currents for frequency or offset, A, with an exponent of 1.5 are input to transistors 5412 and 5422. The analog current for inductance or capacitance is input to the base of bipolar transistor 5424. In turn, comparator circuit generates a voltage in accordance with the following expression:

$$V\text{out} = Vt \ln\left(\frac{1}{Is} \frac{Inum}{Iden}\right)$$

Figure 55:
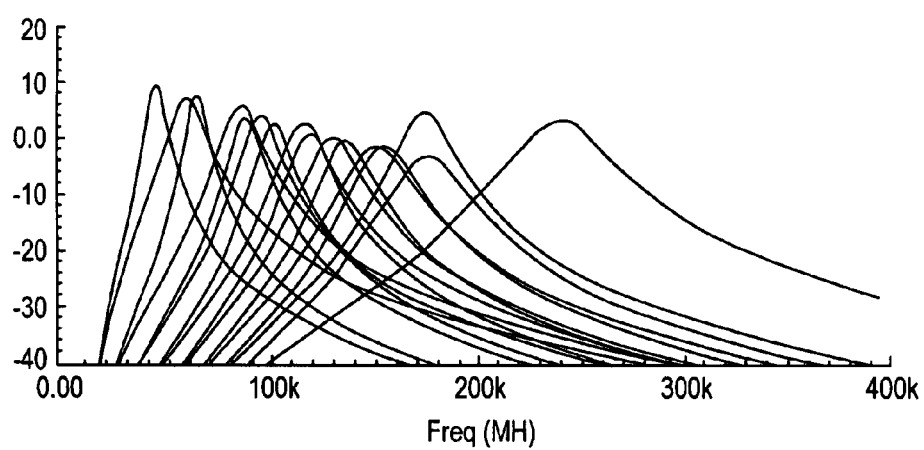
FIG. 55 illustrates a plurality of frequency responses for one embodiment of the LC filter bank.

FIG. 55 illustrates a plurality of frequency responses for one embodiment of the LC filter bank. As shown in FIG. 55, the LC filter bank, through selection of different inductors and capacitors, generates a wide range of frequency responses. The LC filter bank is a tunable filter that may be used in circuits that operate on a wide range of frequencies, such as a television receiver. The LC filter banks filters (i.e., discrete passive filters) enhance the performance of the tuner circuit. The use of a continuous or active filter requires a power supply voltage (e.g., $V_{cc}$). The power supply voltage exhibits a ripple due to noise on the voltage supply line. This ripple voltage, in turn, causes unacceptable frequency response characteristics on the output of the continuous amplifier. Thus, the use of the discrete or passive filters in the receiver isolate the signal from ripple voltage, thereby improving signal quality.

Although the present invention has been described in terms of specific exemplary embodiments, it will be appreciated that various modifications and alterations might be made by those skilled in the art without departing from the spirit and scope of the invention.

What is claimed is:

1. A monolithic integrated circuit comprising:
   tuner for receiving a radio frequency (RF) television signal, said RF television signal comprising a range of fundamental frequencies from 55 mega hertz (Mhz) to 210 Mhz, said tuner for down converting said RF television signal to an intermediate frequency (IF) television signal, said IF television signal comprising a fundamental frequency below 20 Mhz said tuner comprising,
   first down conversion circuit coupled to receive said RF television signals comprising fundamental frequencies in an upper range of said RF television signals, said first down conversion circuit for generating a first IF television signal for said upper range of said RF television signals in a first mode; and
   second down conversion circuit, coupled to said first down conversion circuit and coupled to receive a lower range of said RF television signals, said second down conversion circuit converting said first IF television signal to said fundamental frequency of said IF television signal in said first mode of operation, and said second down conversion circuit converting said lower range of said RF television signals to said fundamental frequency of said IF television signal in a second mode of operation; and IF demodulator circuit comprising a Nyquist filter, coupled to said tuner, for receiving said IF television signal and for filtering said IF television signal, in accordance with a Nyquist filter response, at a frequency below 20 Mhz.

2. The monolithic integrated circuit as set forth in claim 1, wherein a fundamental frequency for said first IF television signal varies depending upon said fundamental frequency of said upper range of said RF television signals.

3. The monolithic integrated circuit as set forth in claim 1, wherein said first down conversion circuit and said second down conversion circuit comprise a plurality of selectable discrete filters.

4. The monolithic integrated circuit as set forth in claim 3, wherein said selectable discrete filters comprise a plurality of selectable capacitive, inductive and resistive elements configured based on said fundamental frequency of said RF television signal.

5. The monolithic integrated circuit as set forth in claim 3, wherein said discrete filters comprise self-aligned tracking filters.

6. A monolithic integrated circuit comprising:

tuner for receiving a radio frequency (RF) television signal, said RF television signal comprising a range of fundamental frequencies from 55 mega hertz (Mhz) to 210 Mhz, said tuner for down converting said RF television signal to an intermediate frequency (IF) television signal;

IF demodulator circuit, coupled to said tuner, for down converting said IF television signal to a baseband television signal, said IF demodulator circuit comprising:

first down conversion circuit coupled to receive said RF television signals comprising fundamental frequencies in an upper range of said RF television signals, said first down conversion circuit for generating a first IF television signal for said upper range of said RF television signals in a first mode; and second down conversion circuit, coupled to said first down conversion circuit and coupled to receive a lower range of said RF television signals, said second down conversion circuit converting said first IF television signal to said baseband television signal in said first mode of operation, and said second down conversion circuit converting said lower range of said RF television signals to said baseband television signal in a second mode of operation; and Nyquist filter, coupled to said tuner, for receiving said baseband television signal and for filtering said baseband television signal in accordance with a Nyquist filter response.

7. The monolithic integrated circuit as set forth in claim 6, wherein a fundamental frequency for said first IF television signal varies depending upon said fundamental frequency of said upper range of said RF television signals.

8. The monolithic integrated circuit as set forth in claim 6, wherein said first down conversion circuit and said second down conversion circuit comprise a plurality of selectable discrete filters.

9. The monolithic integrated circuit as set forth in claim 8, wherein said selectable discrete filters comprise a plurality of selectable capacitive, inductive and resistive elements configured based on said fundamental frequency of said RF television signal.

10. The monolithic integrated circuit as set forth in claim 8, wherein said discrete filters comprise self-aligned tracking filters.

* * * * *